US009721664B2

(12) United States Patent
Nam et al.

(10) Patent No.: US 9,721,664 B2
(45) Date of Patent: Aug. 1, 2017

(54) MEMORY DEVICES AND METHODS OF OPERATING THE MEMORY DEVICES BY PROGRAMMING NORMAL CELLS AFTER PROGRAMMING A FIRST DUMMY CELL

(71) Applicants: Sang-wan Nam, Hwaseong-si (KR); Kyung-min Kang, Suwon-si (KR)

(72) Inventors: Sang-wan Nam, Hwaseong-si (KR); Kyung-min Kang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/605,433

(22) Filed: Jan. 26, 2015

(65) Prior Publication Data
US 2015/0294724 A1 Oct. 15, 2015

(30) Foreign Application Priority Data

Apr. 14, 2014 (KR) ........................ 10-2014-0044425

(51) Int. Cl.
*G11C 11/34* (2006.01)
*G11C 16/10* (2006.01)
*G11C 16/04* (2006.01)
*G11C 7/14* (2006.01)

(52) U.S. Cl.
CPC ................ *G11C 16/10* (2013.01); *G11C 7/14* (2013.01); *G11C 16/0483* (2013.01)

(58) Field of Classification Search
CPC ......... G11C 16/08; G11C 16/16; G11C 16/28; G11C 16/0483; G11C 11/5642
USPC .............. 365/185.17, 185.11, 185.18, 185.2, 365/185.24, 185.29, 185.33
See application file for complete search history.

(56) References Cited

U.S. PATENT DOCUMENTS 7,974,130 B2 * 7/2011 Nakamura ......... G11C 16/0483
365/185.17
8,107,297 B2 1/2012 Baek et al.
8,199,579 B2 6/2012 Shiino et al.
(Continued)

FOREIGN PATENT DOCUMENTS

KR 0170710 3/1999
KR 20110001574 U 1/2011

OTHER PUBLICATIONS

Korean patent application No. 10-2013-0159384 filed on Dec. 19, 2013, entire document.*

*Primary Examiner* — Trong Phan
(74) *Attorney, Agent, or Firm* — Harness, Dickey & Pierce, P.L.C.

(57) ABSTRACT

A method of operating a memory device including a first memory block having a plurality cell strings is provided. Each of the plurality of cell strings includes a string selection transistor connected in series to a first dummy cell, a plurality of normal cells, a second dummy cell and a ground selection transistor. The method includes programming the first dummy cell, and programming the normal cells in at least one of the cell strings after the programming the first dummy cell. The normal cells are selected based on a first program command inputted to the memory device. The programming the first dummy cell is performed at least twice before the normal cells are programmed. A number of times of programming the first dummy cell is different according to a level of a voltage applied to the first dummy cell and a level of a voltage applied to the normal cells.

20 Claims, 20 Drawing Sheets

(56) References Cited

U.S. PATENT DOCUMENTS

| | | | |
|---|---|---|---|
| 8,488,381 B2 | 7/2013 | Kim et al. | |
| 8,488,386 B2 | 7/2013 | Kim et al. | |
| 8,546,869 B2 * | 10/2013 | Lee | H01L 27/11551 |
| | | | 365/185.2 |
| 9,013,923 B2 * | 4/2015 | Park | G11C 16/10 |
| | | | 365/185.17 |
| 9,196,365 B2 * | 11/2015 | Park | G11C 16/10 |
| 2011/0305079 A1 | 12/2011 | Park et al. | |
| 2012/0140562 A1 | 6/2012 | Choe et al. | |
| 2013/0088921 A1 | 4/2013 | Nam et al. | |
| 2013/0182505 A1 | 7/2013 | Liu et al. | |

* cited by examiner

VI-VI'

| SSL | DWL1 DWL2 | DWL3 DWL4 | NWL1~ NWL24 | GSL |
|---|---|---|---|---|
| 0V | 9V | 3V | 10V | 0V |

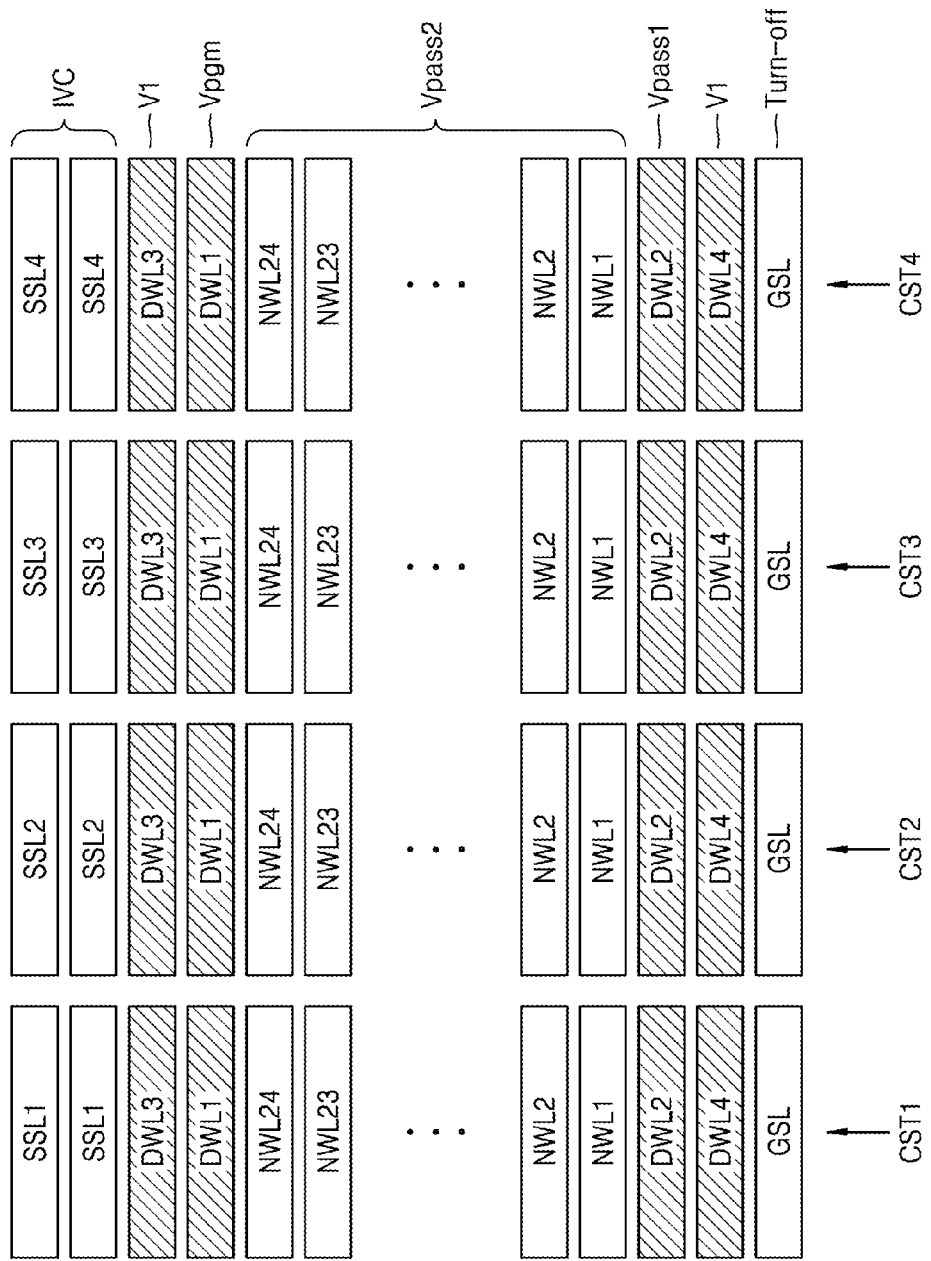

| SSL | DWL1 | DWL2 | DWL3 DWL4 | NWL1~ NWL24 | GSL |
|-----|------|------|-----------|-------------|-----|
| IVC | 15V | 9V | 3V | 9V | 0V |

MEMORY DEVICES AND METHODS OF OPERATING THE MEMORY DEVICES BY PROGRAMMING NORMAL CELLS AFTER PROGRAMMING A FIRST DUMMY CELL

CROSS-REFERENCE TO RELATED APPLICATION

This application claims priority under 35 U.S.C. §119 to Korean Patent Application No. 10-2014-0044425, filed on Apr. 14, 2014, in the Korean Intellectual Property Office, the disclosure of which is incorporated herein in its entirety by reference.

BACKGROUND

The present disclosure relates to memory devices and/or methods of operating the same.

Normal cells may be vertically stacked in each unit chip to increase the integration density of a memory device. In such a case, leakage currents in the stacked normal cells may increase.

SUMMARY

The present disclosure relates to memory devices and/or methods of operating the same.

According to example embodiments of inventive concepts, a memory device includes a memory cell array, a controller, and a driver. The memory cell array includes a first memory block on a substrate. The first memory block includes a plurality of cell strings on the substrate. The plurality of cell strings extend in a vertical direction perpendicular to the substrate. The controller includes a normal program controller and a dummy program controller. The normal program controller is configured to generate a first control signal for programming normal cells of a selected cell string among the plurality of cell strings that is selected based on an address received by the controller. The dummy program controller is configured to generate a second control signal for programming at least one dummy cell included in each of the plurality of cell strings before the normal program controller generates the first control signal. The driver is configured to apply a first operation voltage set for programming the normal cells of the selected cell string to the first memory block in response to the first control signal and the driver is configured to apply a second operation voltage set for programming the at least one dummy cell to the first memory block in response to the second control signal.

In example embodiments, the dummy program controller may be configured to generate the second control signal prior to the normal program controller generates the first control signal, in response to the controller receiving a program command. The program command may instruct the controller to program the normal cells of the selected cell string.

In example embodiments, the dummy program controller may be configured to generate the second control signal after an erasure of the first memory block, regardless of whether the controller recites a program command.

In example embodiments, the dummy program controller may generate the second control signal such that the second control signal may correspond to programming the at least one dummy cell by a hot carrier injection (HCI) mechanism to increase a threshold voltage of the at least one dummy cell. The driver may be configured to apply the second operation voltage set to the first memory block for programming the at least one dummy cell by the HCI mechanism in response to receiving the second control signal. Applying the second operation voltage set may include applying a ground voltage to a string selection transistor and a ground selection transistor in each of the plurality of cell strings, applying a first pass voltage to a first dummy cell connected in series to the string selection transistor and a second dummy cell connected in series to the ground selection transistor, and applying a second pass voltage to the normal cells connected in series between the first dummy cell and the second dummy cell.

In example embodiments, the dummy program controller may be configured to generate the second control signal such that second control signal may correspond to programming the at least one dummy cell by a Fowler-Nordheim (F-N) tunneling mechanism to increase a threshold voltage of the at least one dummy cell. The driver may be configured to apply the second operation voltage set to the first memory block for programming the at least one dummy cell by the F-N tunneling mechanism in response to receiving the second control signal. Applying the second operation voltage set may include applying a first voltage to a string selection transistor included in each of the plurality of cell strings, applying a ground voltage to a ground selection transistor included in each of the plurality of cell strings, applying a program voltage to a first dummy cell connected in series to the string selection transistor, applying a first pass voltage to a second dummy cell connected in series to the ground selection transistor, and applying a second pass voltage to the normal cells connected in series between the first dummy cell and the second dummy cell.

In example embodiments, the driver may be configured to increase a threshold voltage of the at least one dummy cell of at least one cell string among the plurality of cell strings by selectively programming the at least one dummy cell using a Fowler-Nordheim (F-N) tunneling mechanism. A threshold voltage of the at least one string selection transistor or at least one ground selection transistor in the at least one cell string may be lower than a first reference voltage.

According to example embodiments of inventive concepts, a method of operating a memory device is provided. The memory device includes a first memory block having a plurality cell strings. Each of the plurality of cell strings includes a string selection transistor connected in series to a first dummy cell, a plurality of normal cells, a second dummy cell and a ground selection transistor. In such a case, the method includes programming the first dummy cell and programming the normal cells in at least one of the plurality of cell strings after the programming the first dummy cell. The normal cells are programmed based on a first program command inputted to the memory device.

In example embodiments, the programming of the first dummy cell may be performed in response to the first program command or may be performed after an erasure operation of the first memory block regardless of the first program command being input to the memory device.

In example embodiments, the programming the first dummy cell may include programming the first dummy cell, applying a ground voltage to the string selection transistors and the ground selection transistors, applying a first pass voltage to the first and second dummy cells, and applying a second pass voltage to the plurality of normal cells.

In example embodiments, the programming the first dummy cell may include applying a first voltage to the string selection transistors, applying a ground voltage to the ground selection transistors, applying a program voltage to the first dummy cells, and applying a pass voltage to the second dummy cells and the plurality of normal cells.

In example embodiments, each of the plurality of cell strings may further include a third dummy cell between the string selection transistor and the first dummy cell, and each of the plurality of cell strings may further include a fourth dummy cell between the ground selection transistor and the second dummy cell. In such a case, the programming the first dummy cell may further include applying a voltage lower than the pass voltage to the third and fourth dummy cells.

In example embodiments, the programming of the first dummy cell may be selectively performed on at least one cell string if a threshold voltage of the string selection transistor or the ground selection transistor is lower than a first reference voltage.

In example embodiments, the programming the first dummy cell may be performed at least twice before the normal cells are programmed. The number of times of programming the first dummy cell may be different according to a level of a voltage applied to the first dummy cell and a level of a voltage applied to the plurality of normal cells.

In example embodiments, the method may further include erasing the first memory block after the normal cells are programmed and reprogramming the first dummy cell. The reprogramming the first dummy cell may be performed using a voltage different from the program voltage which is applied to the first dummy cell in programming the first dummy cell.

In example embodiments, the method may further include programming the normal cells in at least one cell string selected by a second program command additionally inputted to the memory device after the first dummy cells are reprogrammed. The programming of the normal cells in the at least one cell string selected by the second program command may be performed using a voltage different from the voltage that is used in the programming the normal cells of the at least one cell string selected by the first program command.

According to example embodiments of inventive concepts, a method of operating a memory device is provided. The memory device includes a memory cell array, a controller, and a driver. The method includes increasing a threshold voltage of at least one dummy cell in at least one of a plurality of cell strings in a selected memory block of the memory cell array. Each of the plurality of cell strings includes a string selection transistor connected in series to a first dummy cell, a plurality of normal cells, a second dummy cell, and a ground selection transistor. The method further includes programming the plurality of normal cells in a selected string among the plurality of cell strings after the increasing the threshold voltage of the at least one dummy cell.

In example embodiments, the increasing the threshold voltage of the at least one dummy cell may include using one of a hot carrier injection (HCI) mechanism and a Fowler-Nordheim (F-N) tunneling mechanism to program the at least one dummy cell. The at least one dummy cell may include the first dummy cell and the second dummy cell in the at least one of the plurality of cell strings.

In example embodiments, the HCI mechanism may be used during the increasing the threshold voltage of the at least one dummy cell. The HCI mechanism may include turning the string selection transistor and the ground selection transistor off in the at least one of the plurality of cell strings, applying a first pass voltage to the first dummy cell and the second dummy cell in the at least one of the plurality of cell strings, and applying a second pass voltage to the plurality of normal cells in the at least one of the plurality of cell strings. The second pass voltage may be greater than the first pass voltage.

In example embodiments, the F-N tunneling mechanism may be used during the increasing the threshold voltage of the at least one dummy cell. The F-N tunneling mechanism may include turning the ground selection transistor off in the at least one of the plurality of cell strings, applying a first voltage to the string selection transistor in the at least one of the plurality of cell strings, applying a program voltage to the first dummy cell in the at least one of the plurality of cell strings, applying a first pass voltage to the second dummy cell in the at least one of the plurality of cell strings, and applying a second pass voltage to the plurality of normal cells in the at least one of the plurality of cell strings. A value of the first pass voltage may be greater than a value of a ground voltage and less than a value of the program voltage. A value of the second pass voltage may be greater than the value of the ground voltage and less than the value of the program voltage. The first voltage may be a power supply voltage.

In example embodiments, in each of the plurality of cell strings, the second dummy cell may be on the ground selection transistor, the plurality of normal cells may be on the second dummy cell, the first dummy cell may be on the plurality of normal cells, and the string selection transistor may be one the first dummy cell. The programming the plurality of normal cells in the selected string may be performed in response to a program command received by the controller, a control signal generated by the controller and transferred to the driver in response to the program command, and an address decoded by the driver. The programming the plurality of normal cells in the selected string may include the driver applying an operation voltage set to the selected string in response to the control signal transferred to the driver by the controller. The increasing the threshold voltage of the at least one dummy cell may be performed in response to the controller receiving the programming command, or the increasing the threshold voltage of the at least one dummy cell may be performed after performing an erasure operation on the memory block regardless of the controller receiving the programming command.

BRIEF DESCRIPTION OF THE DRAWINGS

I Example embodiments of inventive concepts will be more clearly understood from the following description of non-limiting embodiments, as illustrated in the accompanying drawings in which like reference characters refer to like parts throughout the different views. The drawings are not necessarily to scale, emphasis instead being placed upon illustrating principles of inventive concepts. In the drawings:

FIG. 18A illustrates a bias condition applied to strings of a memory cell array having a different structure from the strings of FIG. 17 to program dummy cells;

DETAILED DESCRIPTION OF EXAMPLE EMBODIMENTS

Figure 1:
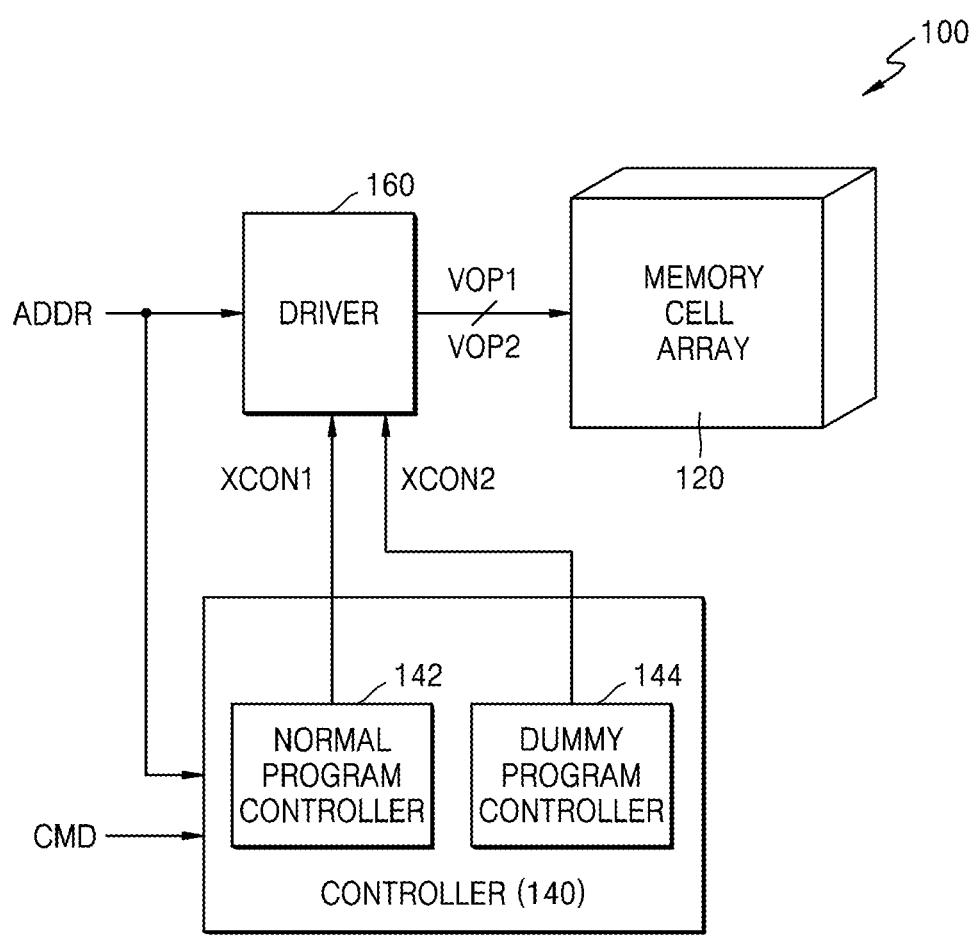
FIG. 1 is a block diagram illustrating a memory device according to example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular terms "a," "an" and "the" are intended to include the plural forms as well, unless the context clearly indicates otherwise. It will be understood that the terms "comprises", "comprising,", "includes", "including", "have" and/or "having" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms such as those defined in commonly used dictionaries should be interpreted as having meanings that are consistent with their meanings in the context of this specification and the relevant art and will not be interpreted in an idealized or overly formal sense unless expressly so defined herein.

Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

FIG. 1 is a block diagram illustrating a memory device 100 according to example embodiments of inventive concepts.

Figure 2:
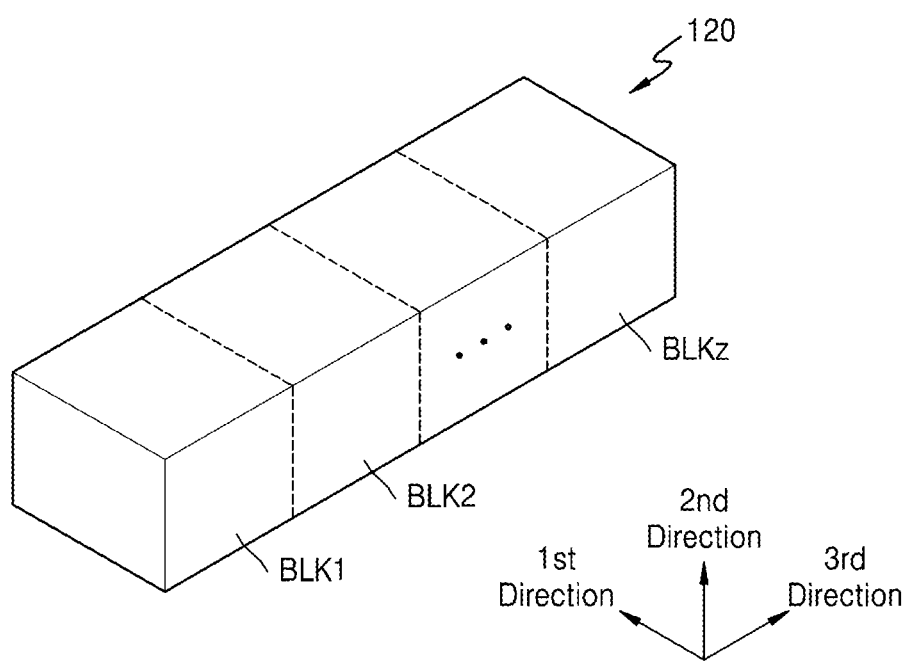
FIG. 2 is a schematic view illustrating a memory cell array included in the memory device of FIG. 1.

Referring to FIG. 1, the memory device 100 may include a memory cell array 120, a controller 140 and a driver 160. The memory device 100 may be a non-volatile memory device. For example, the memory device 100 may be a NAND-type flash memory device. The memory cell array 120 may include a plurality of memory blocks BLK1~BLKz. FIG. 2 illustrates an example of the memory cell array 120 of FIG. 1. Each of the plurality of memory blocks BLK1~BLKz may have a three-dimensional structure (or a vertical two-dimensional structure). For example, each of the plurality of memory blocks BLK1~BLKz may have a cubic structure (or rectangular structure) extending in first, second, and third directions which are orthogonal to each other, as illustrated in FIG. 2. In example embodiments, each of the plurality of memory blocks BLK1~BLKz may include a plurality of NAND strings, and each NAND string may extend in the second direction (corresponding to a height direction of FIG. 3). That is, the plurality of NAND strings, which are disposed to be parallel with the second direction, may be arrayed in the first and third directions.

Figure 3:
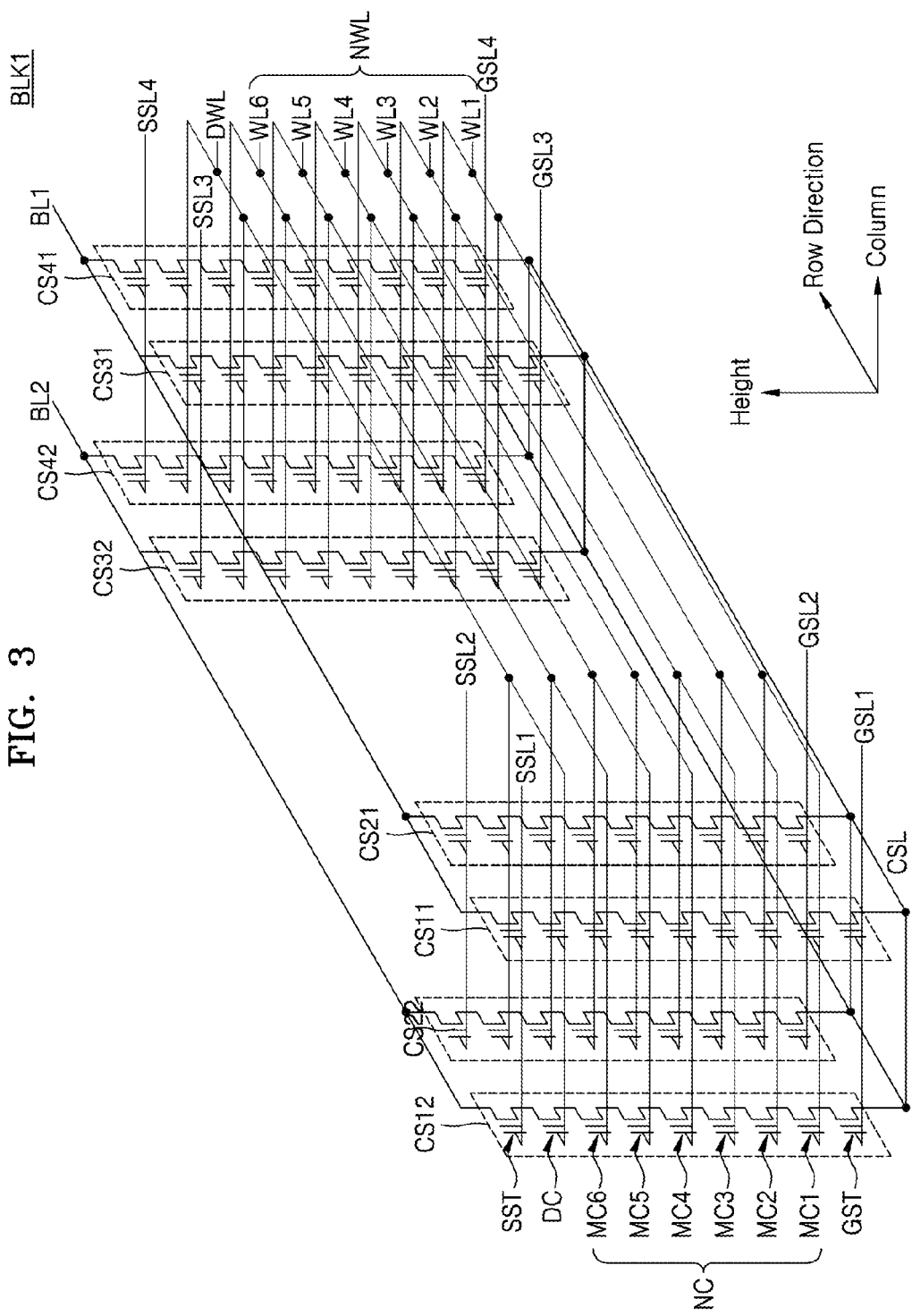
FIG. 3 is an equivalent circuit diagram illustrating a first memory block included in the a memory cell array of FIG. 2.

FIG. 3 is an equivalent circuit diagram illustrating the first memory block BLK1 included in the memory cell array 120 of FIG. 2.

Referring to FIG. 3, the first memory block BLK1 may include a plurality of cell strings CS11~CS41 and CS12~CS42. The plurality of cell strings CS11~CS41 and CS12~CS42 may be arrayed in a column direction and a row direction.

Each cell string may include a ground selection transistor GST, normal cells MC1~MC6, and a string selection transistor SST. The ground selection transistor GST, the normal cells MC1~MC6, and the string selection transistor SST may be electrically connected in series and may be stacked in a height direction orthogonal to the row direction and the column direction. That is, the ground selection transistor GST, the normal cells MC1~MC6 and the string selection transistor SST constituting each cell string may be vertically stacked on a substrate (not shown).

The cell strings arrayed in each row may be connected to the same string selection line. For example, the string selection transistors SST of the cell strings CS11 and CS12 arrayed in a first row may be connected to a first string selection line SSL1, and the string selection transistors SST of the cell strings CS21 and CS22 arrayed in a second row may be connected to a second string selection line SSL2. Similarly, the string selection transistors SST of the cell strings CS31 and CS32 arrayed in a third row may be connected to a third string selection line SSL3, and the string selection transistors SST of the cell strings CS41 and CS42 arrayed in a fourth row may be connected to a fourth string selection line SSL4.

The cell strings arrayed in each column may be connected to the same bit line. For example, the string selection transistors SST of the cell strings CS11, CS21, CS31 and CS41 arrayed in a first column may be connected to a first bit line BL1, and the string selection transistors SST of the cell strings CS12, CS22, CS32 and CS42 arrayed in a second column may be connected to a second bit line BL2.

The cell strings arrayed in each row may be connected to the same ground selection line. For example, the ground selection transistors GST of the cell strings CS11 and CS12 arrayed in the first row may be connected to a first ground selection line GSL1, and the ground selection transistors GST of the cell strings CS21 and CS22 arrayed in the second row may be connected to a second ground selection line GSL2. Similarly, the ground selection transistors GST of the cell strings CS31 and CS32 arrayed in the third row may be connected to a third ground selection line GSL3, and the ground selection transistors GST of the cell strings CS41 and CS42 arrayed in the fourth row may be connected to a fourth ground selection line GSL4.

The normal cells located at the same height from the substrate (or the ground selection transistors GST) may be electrically connected to a single word line. For example, the first normal cells MC1 of the cell strings CS11~CS41 and CS12~CS42 may be electrically connected to a first normal word line WL1, and the second normal cells MC2 of the cell strings CS11~CS41 and CS12~CS42 may be electrically connected to a second normal word line WL2. Similarly, the third normal cells MC3 of the cell strings CS11~CS41 and CS12~CS42 may be electrically connected to a third normal word line WL3, and the fourth normal cells MC4 of the cell strings CS11~CS41 and CS12~CS42 may be electrically connected to a fourth normal word line WL4. Moreover, the fifth normal cells MC5 of the cell strings CS11~CS41 and CS12~CS42 may be electrically connected to a fifth normal word line WL5, and the sixth normal cells MC6 of the cell strings CS11~CS41 and CS12~CS42 may be electrically connected to a sixth normal word line WL6.

Sources of the ground selection transistors GST of the cell strings CS11~CS41 and CS12~CS42 may be electrically connected to a common source line CSL.

Each of the cell strings CS11~CS41 and CS12~CS42 may further include a dummy cell DC. The dummy cell DC of each cell string may be coupled between the string selection transistor SST and the sixth normal cell MC6. The dummy cells DC of the cell strings CS11~CS41 and CS12~CS42 may be electrically connected to a dummy word line DWL and may be controlled by a signal applied to the dummy word line DWL. The dummy cells DC may improve the operation characteristics of the cell strings CS11~CS41 and CS12~CS42. For example, the dummy cells DC may limit (and/or prevent) the operation characteristics of the cell strings CS11~CS41 and CS12~CS42 from degrading even when the characteristics of the string selection transistors SST degrade. Moreover, the dummy cells DC may limit (and/or prevent) the operation characteristics of the cell strings CS11~CS41 and CS12~CS42 from degrading due to a difference between a voltage applied to the string selection transistors SST and a voltage applied to the normal cells MC1~MC6 during operations of the normal cells MC1~MC6 of the cell strings CS11~CS41 and CS12~CS42.

The other memory blocks BLK2~BLKz shown in FIG. 2 may have the same configuration as the first memory block BLK1 shown in FIG. 3. However, the first memory block BLK1 shown in FIG. 3 is merely an example of a suitable memory block for the memory cell array 120. In other words, example embodiments are not limited to the first memory block BLK1 shown in FIG. 3. For example, in example embodiments, each of the cell strings CS11~CS41 and CS12~CS42 may include two or more string selection transistors SST and/or two or more ground selection transistors GST. Furthermore, the number of the rows in which the cell strings are arrayed may be larger or smaller. If the number of the rows in which the cell strings are arrayed is changed, the number of the string selection lines and the number of the cell strings connected to a single bit line may be changed. If the number of the rows in which the cell strings are arrayed is changed, the number of the ground selection lines connected to the cell strings may also be changed.

The number of the columns in which the cell strings are arrayed may also be larger or smaller. If the number of the columns in which the cell strings are arrayed is changed, the number of the bit lines connected to the cell strings and the number of the cell strings connected to a single bit line may also be changed.

The height of the cell strings may also be larger or smaller. For example, the number of the memory cells (e.g., a total number of the normal cells NC and the dummy cells DC) included in each cell string may be larger or smaller. If the number of the memory cells included in each cell string is changed, the number of the word lines (e.g., a total number of the normal word lines NWL and the dummy word lines DWL) may also be changed. In addition, the number of the string selection transistor SST or the ground selection transistor GST included in each cell string may be larger. If the number of the string selection transistor SST or the ground selection transistor GST included in each cell string is increased, the number of the string selection line or the ground selection line connected to each cell string may also be increased. If the number of the string selection transistor SST or the ground selection transistor GST included in each cell string is increased, the string selection transistors SST or the ground selection transistors GST included in each cell string may be serially connected or sequentially stacked like the normal cells MC1~MC6.

In example embodiments, a write operation (e.g., a program operation) or a read operation may be performed in rows of the cell strings CS11~CS41 and CS12~CS42. For example, during the write operation or the read operation, the cell strings arrayed in any one of the rows may be selected according to a logic combination of signals applied to the ground selection lines GSL1~GSL4 and the string selection lines SSL1~SSL4. In such a case, the same voltage may be applied to two ground selection lines GSL1 and GSL2 or GSL3 and GSL4 or all of the ground selection lines GSL1~GSL4.

After the cell strings arrayed in a single row are selected, the write operation or the read operation may be performed in units of pages. Each page may be composed of the memory cells which are included in the selected cell strings and are connected to a single word line. If the cell strings arrayed in a single row are selected, the memory cells in the selected cell strings may be selected in pages according to signals applied to the word lines.

Figure 4A:
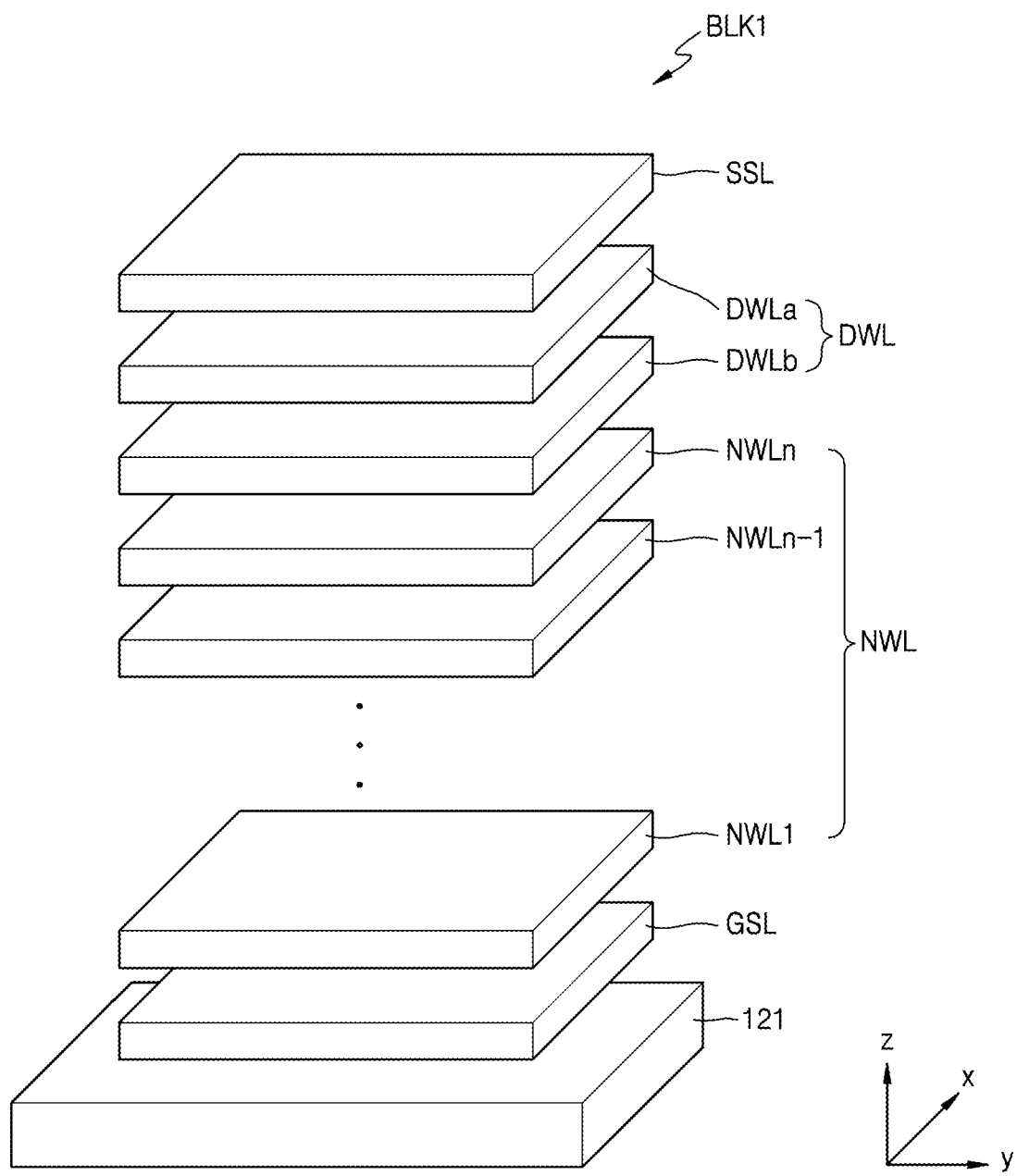
FIGS. 4A and 4B are schematic views illustrating examples of a first memory block in FIG. 2.

Although FIG. 3 illustrates an example in which each of the cell strings CS11~CS41 and CS12~CS42 includes only a single dummy cell DC, example embodiments are not limited thereto. Referring to FIG. 4A illustrating another example of the first memory block BLK1 of FIG. 3, the first memory block BLK1 may include a plurality of layers stacked on a substrate in a Z-axis direction perpendicular to the substrate 121, and the plurality of layers stacked on the substrate 121 may include a string selection line SSL, dummy word lines DWL, normal word lines N WL (e.g., NWL1 to NWLn, including NWLn-1) and a ground selection line GSL. The string selection line SSL may be electrically connected to string selection transistors, and the dummy word lines DWL may be electrically connected to dummy cells. In addition, the normal word lines NWL may be electrically connected to normal cells, and the ground selection line GSL may be electrically connected to ground selection transistors. The string selection transistors, the dummy cells, the normal cells and the ground selection transistors connected to the plurality of layers are not shown in FIG. 4A to avoid complexity of drawing.

Figure 4B:
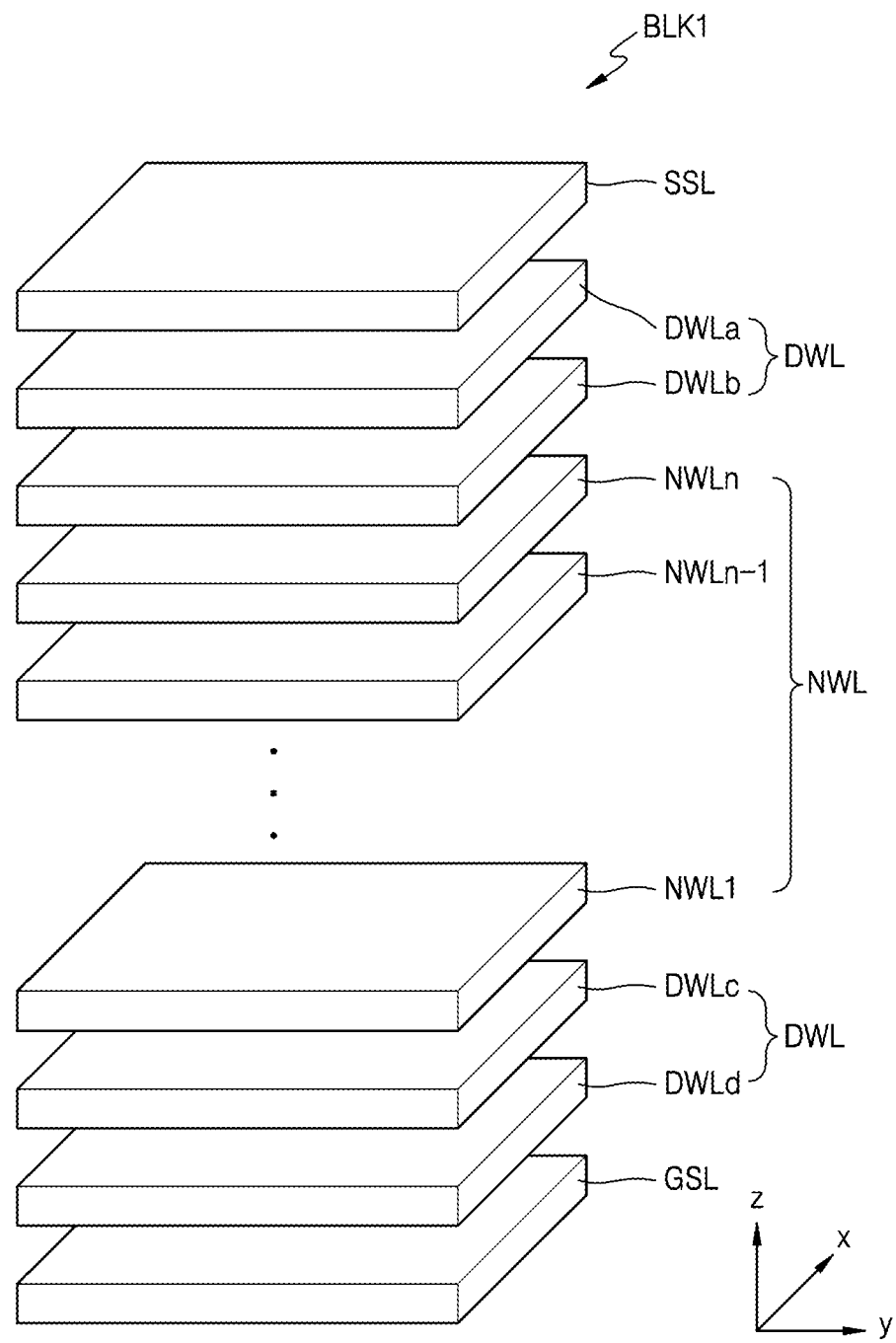

As illustrated in FIG. 4A, the dummy word lines DWL may be configured to include two adjacent layers DWLa and DWLb which are adjacent to the string selection line SSL. Alternatively, referring to FIG. 4B illustrating still another example of the first memory block BLK1 of FIG. 3, the first memory block BLK1 may include a pair of dummy word lines DWLa and DWLb adjacent to the string selection line SSL and a pair of dummy word lines DWLc and DWLd adjacent to the ground selection line GSL. In example embodiments, the dummy word lines DWL may be configured to include a first dummy word line adjacent to the string selection line SSL and a second dummy word line adjacent to the ground selection line GSL. The dummy word lines DWL or dummy cells connected to the dummy word lines DWL may be introduced to reduce (and/or minimize) undesired effects when the characteristics of the cell string are degraded due to voltages applied to the string selection line SSL, the dummy word lines DWL, the normal word lines NWL and the ground selection line GSL during an operation of the memory device 100.

Figure 5:
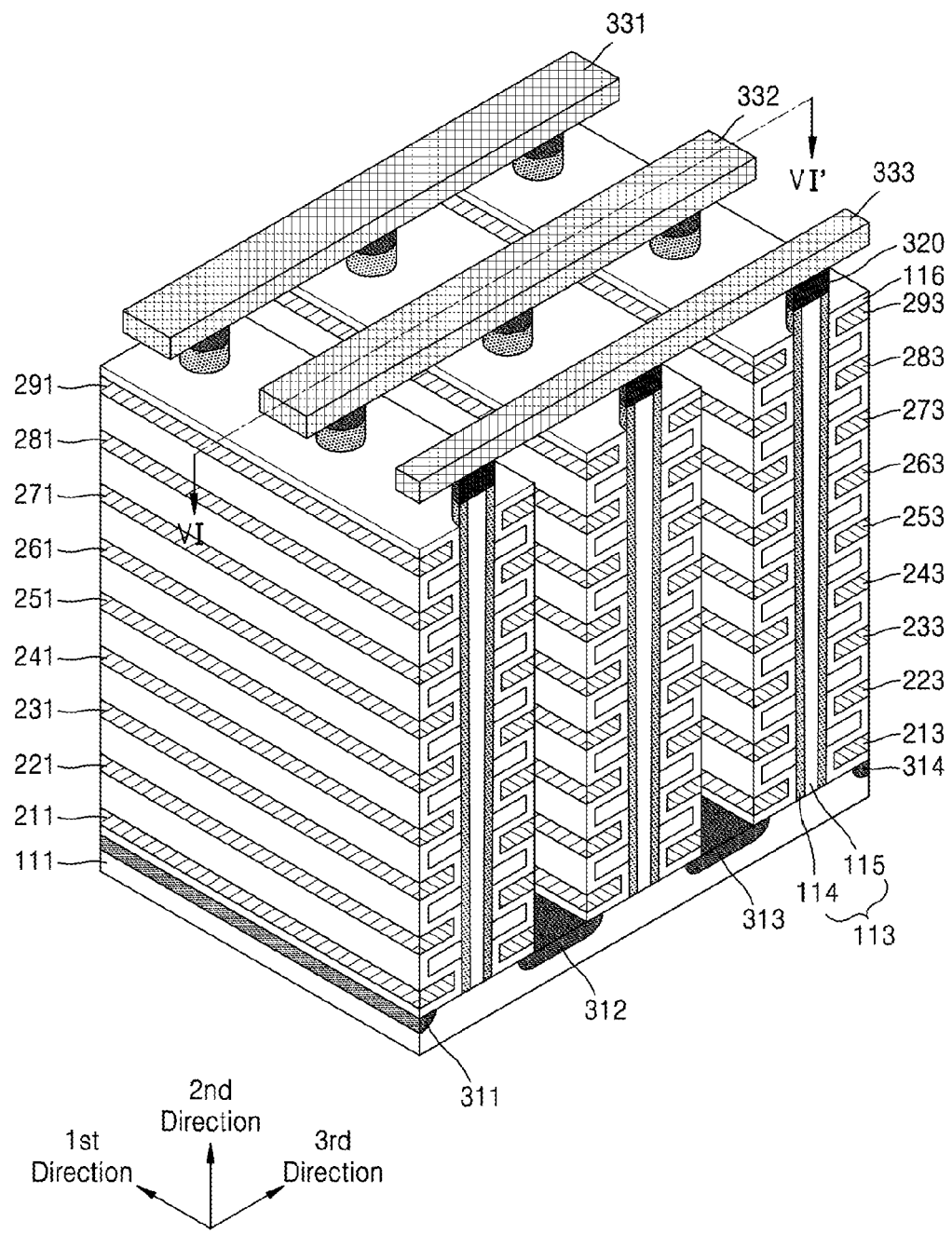
FIG. 5 illustrates a perspective view corresponding to the equivalent circuit diagram of the first memory block shown in FIG. 3.
Figure 6:
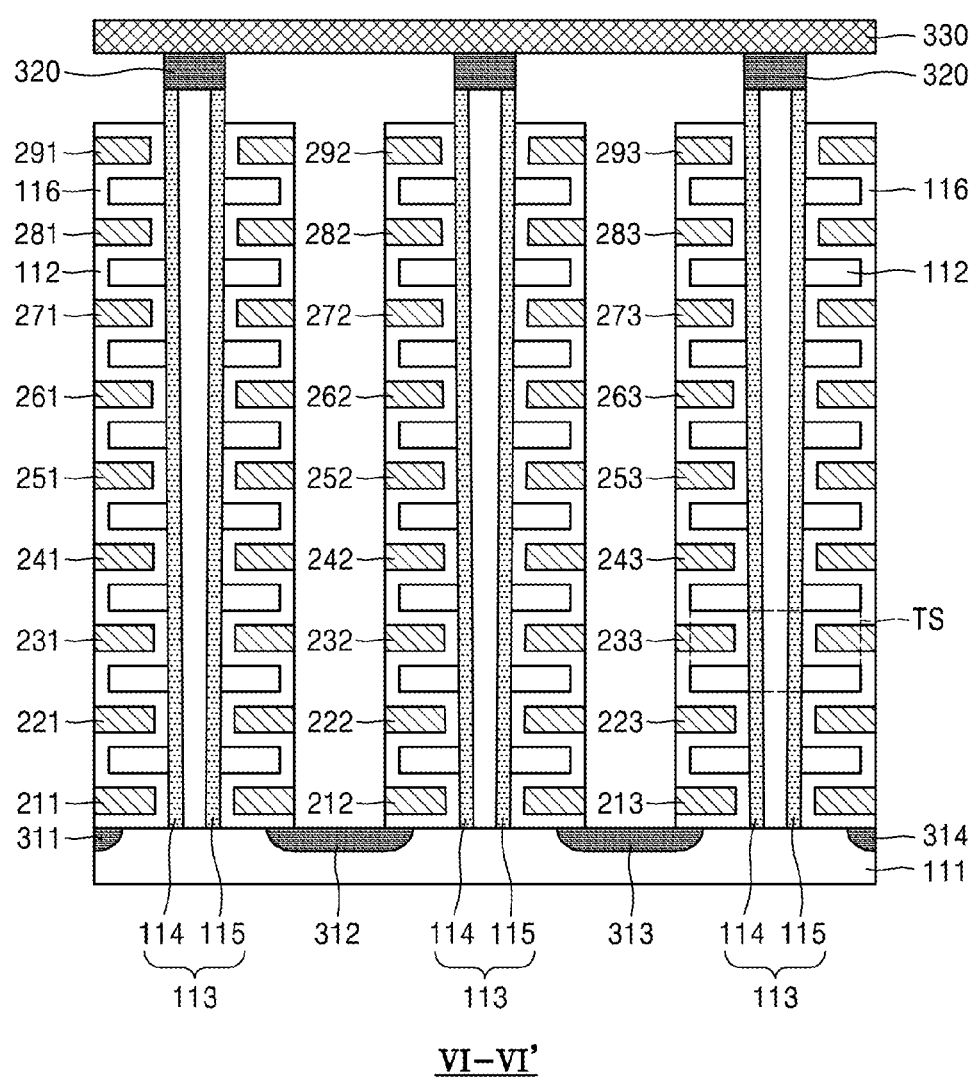
FIG. 6 is a cross-sectional view taken along a line VI-VI' of FIG. 5.

FIG. 5 illustrates a perspective view corresponding to the equivalent circuit diagram of the first memory block shown in FIG. 3, and FIG. 6 is a cross-sectional view taken along a line VI-VI' of FIG. 5.

Referring to FIGS. 4A, 4B and 5, the first memory block BLK1 may have a cubic structure (or rectangular) extending in first, second, and third directions which are orthogonal to each other. Hereinafter, all normal cells and dummy cells will be referred to as memory cells, and all normal word lines and dummy word lines will be referred to as word lines.

First, a substrate 111 may be provided. The substrate 111 may be a silicon substrate. The substrate may be doped with impurities of a first conductivity type. For example, the substrate 111 may be a P-type silicon substrate or a P-type well (e.g., a pocket P well). Hereinafter, a non-limiting example is described where the substrate 111 is a P-type silicon substrate. However, in example embodiments, a material of the substrate 111 may be different than a P-type silicon substrate.

A plurality of doped regions 311~314 extending in a first direction may be disposed on the substrate 111. The doped regions 311~314 may have a second conductivity that is different from the conductivity of the substrate 111. For example, the doped regions 311~314 may have an N-type conductivity. Hereinafter, a non-limiting example is described where the doped regions 311~314 have an N-type conductivity. However, in example embodiments, the doped regions 311~314 may alternatively doped a different conductivity type than N-type regions.

A plurality of insulation patterns 112 may be stacked on the substrate 111 between the first and second doped regions 311 and 312, and the insulation patterns 112 may extend in the first direction to be parallel with the first and second doped regions 311 and 312. That is, the insulation patterns 112 may be stacked on the substrate 111 in a second direction perpendicular to a surface of the substrate 111. The insulation patterns 112 and the substrate 111 may be spaced apart from each other by a desired (and/or alternatively predetermined) distance. In example embodiments, each of the insulation patterns 112 may include an insulating material, such as silicon oxide.

A plurality of pillars 113 may be disposed to penetrate the insulation patterns 112 stacked on the substrate 111. Each pillar 113 may be on a portion of the substrate between two adjacent doped regions. For example, FIGS. 5-6 illustrate a pillar 113 between the first and second doped regions 311 and 312. Each of the plurality of pillars 113 may fully penetrate the insulation patterns 112 to contact the substrate 111. The plurality of pillars 113 may be arrayed in the first direction. The plurality of pillars 113 may be spaced apart from each other in the 3rd direction.

Each of the pillars 113 may include a plurality of materials. For example, each pillar 113 may include a surface layer 114. The surface layer 114 may have cylinder shape and/or the surface layer 114 may be formed of a semiconductor layer (e.g., silicon) doped with impurities of the first conductivity type. That is, the surface layers 114 may have the same conductivity type as the substrate 111. Hereinafter, a non-limiting example is described where each of the surface layers 114 is a P-type silicon layer. However, in example embodiments, each of the surface layers 114 may not be limited to a P-type silicon layer.

Each of the pillars 113 may further include an internal layer 115 filling an internal space surrounded by the surface layer 114. The internal layer 115 may include an insulation material. For example, the internal layer 115 may include a silicon oxide material, but example embodiments are not limited thereto.

An insulation layer 116 may be disposed on the substrate 111 between the first and second doped regions 311 and 312 on surfaces of the insulation patterns 112, the pillars 113, and the substrate 111. A thickness of the insulation layer 116 may be less than half a distance between the insulation patterns 112. That is, the insulation layer 116 may be disposed along a surface profile of the stacked insulation patterns 112 to provide spaces between the stacked insulation patterns 112.

Conductive patterns 211~291 may be disposed on portions of the insulation layer 116 between the first and second doped regions 311 and 312 on the substrate 111. For example, the lowermost conductive pattern 211 may fill a space between the substrate 111 and the lowermost insulation pattern 112 adjacent to the substrate 111 and may extend in the first direction. More specifically, the lowermost conductive pattern 211 may be provided to fill the space surrounded by the insulation layer 116 between the substrate 111 and the lowermost insulation pattern 112 adjacent to the substrate 111.

Each of the conductive patterns 221~281 may fill a space surrounded by the insulation layer 116 between two adjacent insulation patterns 112 and may extend in the first direction. That is, the conductive patterns 221~281 may be disposed in respective ones of the spaces between insulation patterns 112. In addition, the uppermost conductive pattern 291 may be provided on the insulation layer 116 covering a top surface of the uppermost insulation pattern 112 to extend in the first direction. In example embodiments, each of the conductive patterns 211~291 may include a metal material. Alternatively, each of the conductive patterns 211~291 may include a doped semiconductor, such as a doped polysilicon material.

The same (or substantially the same) structure as stacked on the substrate 111 between the first and second doped regions 311 and 312 may be provided on the substrate 111 between the second and third doped regions 312 and 313. For example, a plurality of stacked insulation patterns 112 extending in the first direction, a plurality of pillars 113 penetrating the stacked insulation patterns 112, an insulation layer 116 disposed on surfaces of the insulation patterns 112 and the pillars 113, and a plurality of conductive patterns 212~292 extending in the first direction may be provided on the substrate 111 between the second and third doped regions 312 and 313.

The same (or substantially the same) structure as stacked on the substrate 111 between the first and second doped regions 311 and 312 may also be provided on the substrate 111 between the third and fourth doped regions 313 and 314. For example, a plurality of stacked insulation patterns 112 extending in the first direction, a plurality of pillars 113 penetrating the stacked insulation patterns 112, an insulation layer 116 disposed on surfaces of the insulation patterns 112 and the pillars 113, and a plurality of conductive patterns 213~293 extending in the first direction may be provided on the substrate 111 between the third and fourth doped regions 313 and 314.

Drain regions 320 may be respectively provided on the pillars 113. Each of the drain regions 320 may be formed of a silicon material doped with impurities of a second conductivity type. For example, each of the drain regions 320 may be formed of an N-type silicon material. Hereinafter, a non-limiting example is described where each of the drain regions 320 is formed of an N-type silicon material. However, in example embodiments are not limited thereto and each of the drain regions 320 may be a different material than N-type silicon material. A width of each drain region 320 may be greater than a width of the corresponding pillar 113. Each drain region 320 may be provided on the corresponding pillar 113 in a pad form.

Conductive lines 331, 332, and 333 may be disposed on the drain regions 320 to extend in a third direction orthogonal to the first and second directions. The conductive lines 331, 332, and 333 may be arrayed in the first direction. Each of the conductive lines 331, 332, and 333 may be connected to the corresponding drain regions 320 arrayed in a column parallel with the third direction. In example embodiments, the conductive lines 331, 332, and 333 may be electrically connected to the drain regions 320 through contact plugs. Each of the conductive lines 331, 332, and 333 may include a metal material. Alternatively, each of the conductive lines 331, 332, and 333 may include a doped polysilicon material.

In FIGS. 5 and 6, each pillar 113 and the conductive patterns 211~291, 212~292 or 213~293 may constitute one of a plurality of cell strings. Each of the cell strings may include a plurality of transistor structures TS. The transistor structure TS will be described in more detail with reference to FIG. 7.

Figure 7:
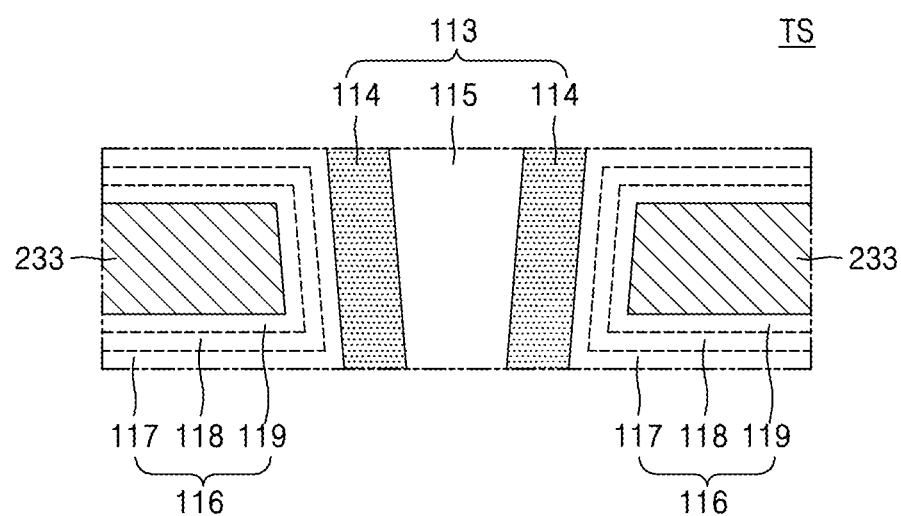
FIG. 7 is an enlarged view illustrating a portion 'TS' of FIG. 6.

FIG. 7 is an enlarged view illustrating a portion of one of the transistor structures 'TS' of FIG. 6. Referring to FIGS. 5, 6, and 7, the insulation layer 116 may include a first sub-insulation layer 117, a second sub-insulation layer 118, and a third sub-insulation layer 119 which are sequentially stacked.

The P-type silicon surface layer 114 of each pillar 113 may act as a channel body of a transistor. The first sub-insulation layer 117 adjacent to the pillar 113 may act as a tunnel insulation layer. The first sub-insulation layer 117 may include, for example, a thermal oxide layer.

The second sub-insulation layer 118 may act as a charge storage layer. For example, the second sub-insulation layer 118 may act as a charge trap layer. In example embodiments, the second sub-insulation layer 118 may include a nitride layer or a metal oxide layer (e.g., an aluminium oxide layer or a hafnium oxide layer).

The third sub-insulation layer 119 adjacent to the conductive pattern 233 may act as a blocking insulation layer. The third sub-insulation layer 119, which is adjacent to the conductive pattern 233 and extends in the first direction, may include a single layered material or a multi-layered material. The third sub-insulation layer 119 may be a high-k dielectric layer having a dielectric constant greater than dielectric constants of the first and second sub-insulation layers 117 and 118. For example, the third sub-insulation layer 119 may include an aluminium oxide layer or a hafnium oxide layer.

The conductive pattern 233 may act as a gate electrode or a control gate electrode. That is, the gate electrode 233 (or the control gate electrode), the blocking insulation layer 119, the charge storage layer 118, the tunnel insulation layer 117 and the channel body 114 may constitute a selection transistor or a memory cell transistor. In example embodiments, the first, second and third sub-insulation layers 117, 118 and 119 may be an oxide/nitride/oxide (ONO) layer. Hereinafter, the P-type silicon surface layer 114 of each pillar 113 may be referred to as a second directional channel body.

The first memory block BLK1 may include the plurality of pillars 113. That is, the first memory block BLK1 may include a plurality of cell strings. In more detail, the first memory block BLK1 may include the plurality of cell strings that extend in the second direction perpendicular to the substrate 111.

Each cell string may include the plurality of transistor structures TS arrayed along the second direction. At least one of the plurality of transistor structures TS of each cell string may act as a string selection transistor (SST of FIG. 3). At least one of the plurality of transistor structures TS of each cell string may act as a ground selection transistor (GST of FIG. 3).

The gate electrodes (or the control gate electrodes) may correspond to the conductive patterns 211~291, 212~292 and 213~293 extending in the first direction. That is, the gate electrodes (or the control gate electrodes) may extend in the first direction to provide a plurality of word lines and at least two selection lines (e.g., at least one string selection line SSL and at least one ground selection line GSL).

The conductive lines 331, 332, and 333 extending in the third direction may be connected to first ends of the cell strings. The conductive lines 331, 332 and 333 may ac as bit lines. That is, in the first memory block BLK1, each of the bit lines 331, 332 and 333 may be electrically connected to the plurality of cell strings arrayed in one column.

The first to fourth doped regions 311~314 extending in the first direction may be adjacent to second ends of the cell strings opposite to the first ends. The first to fourth doped regions 311~314 may constitute a common source line (CSL of FIG. 3).

As described above, the first memory block BLK1 may include the plurality of cell strings that extend in the second direction perpendicular to the substrate 111 and may operate as a NAND-type flash memory block, for example, a charge trap flash (CTF) memory block.

Although FIGS. 5 and 6 illustrate an example in which the conductive patterns 211~291, 212~292 and 213~293 are nine conductive layers, example embodiments are not limited thereto. For example, in example embodiments, the conductive patterns may be realized using eight conductive layer, sixteen conductive layers or more conductive layers. That is, each of the cell strings may include eight transistors, sixteen transistors, or more transistors.

Although FIGS. 5 and 6 illustrate an example in which each of the bit lines 331, 332 and 333 is connected to three cell strings, example embodiments are not limited thereto. For example, in example embodiments, each of the bit lines in the first memory block BLK1 may be electrically connected to two, four or more cell strings. In such a case, the number of the group of the conductive patterns 211~291, 212~292, and 213~293 and the number of the doped regions acting as common source lines may be changed to be equal to the number of the cell strings connected to each bit line 331, 332 or 333.

Although FIGS. 5 and 6 illustrate an example in which each conductive pattern extending in the first direction to act as a gate electrode is connected to three cell strings, example embodiments are not limited thereto. For example, in example embodiments, each conductive pattern extending in the first direction to act as a gate electrode may be connected to two, four, or more cell strings. In such a case, the number of the conductive lines extending in the third direction to act as bit lines may be changed to be equal to the number of the cell strings connected to each conductive pattern acting as a gate electrode.

As illustrated in FIGS. 5, 6, and 7, each of the pillars 113 may have a non-uniform width. That is, each of the pillars 113 may have a sloped sidewall due to the nature of an etch process for forming through holes in which the pillars 113 are disposed. For example, the width of each pillar 113 may be reduced as towards the substrate 111.

The insulation layer 116 may include a silicon oxide layer acting as the tunnel insulation layer 117, a silicon nitride layer acting as the charge storage layer 118, and a silicon oxide layer acting as the blocking insulation layer 119. If a program voltage or an erasure voltage is applied to the conductive pattern (e.g., the control gate electrode), an electric field may be generated between the conductive pattern and the channel body 114.

If the electric field is generated between the conductive pattern and the channel body 114, a voltage difference may be induced between the channel body 114 and the charge storage layer 118, thereby causing an F-N tunnelling phenomenon in the tunnel insulation layer 117. Accordingly, the corresponding memory cell may be programmed or erased by the F-N tunnelling phenomenon. The amount of charges trapped in the charge storage layer 118 during a program operation or the amount of charges ejected from the charge storage layer 118 during an erasure operation may be determined according to an electric field applied to the tunnel insulation layer 117.

The electric field applied to the tunnel insulation layer 117 may be expressed by capacitance values of the tunnel insulation layer 117 and the blocking insulation layer 119. If the width of the pillar 113 decreases, a ratio of an area of the tunnel insulation layer 117 to an area of the blocking insulation layer 119 may be reduced. If the area ratio of the tunnel insulation layer 117 to the blocking insulation layer 119 decreases, a ratio of a capacitance value of the tunnel insulation layer 117 to a capacitance value of the blocking insulation layer 119 may be reduced. If the capacitance ratio of the tunnel insulation layer 117 to the blocking insulation layer 119 decreases, an electric field applied to the tunnel insulation layer 117 may increase. That is, if the capacitance value of the tunnel insulation layer 117 decreases as compared with the capacitance value of the blocking insulation layer 119, a cell coupling ratio may increase, thereby improving a program efficiency and an erasure efficiency of the corresponding memory cell.

Accordingly, if the width of the pillar 113 decreases, the amount of charges trapped in the charge storage layer 118 during the program operation or the amount of charges ejected from the charge storage layer 118 during the erasure operation may increase. That is, the width of the pillar 113 may affect the tunnelling phenomenon that occurs in the tunnel insulation layer 117. Thus, variations of the threshold voltages of the memory cells may be different according to the width of the pillar 113 during the program operation or the erasure operation. Therefore, levels of voltage applied to the word lines may be controlled to compensate for the non-uniform variation of the threshold voltages of the memory cells, which is due to the non-uniform widths of the pillar 113.

Referring again to FIGS. 1, 2, and 3, the controller 140 may include a normal program controller 142 and a dummy program controller 144. The normal program controller 142 may receive a program command CMD and an address ADDR to generate a first control signal XCON1 for programming the normal cells of the cell strings which are selected by the address ADDR. Hereinafter, a non-limiting example is described where the address ADDR is an address for selecting the first memory block BLK1, but example embodiments are not limited thereto and the address ADDR may alternatively be for selecting a different memory block than the first memory block BLK1. The dummy program controller 144 may generate a second control signal XCON2 for programming the dummy cells DC of the cell strings CS11~CS41 and CS12~CS42 of the first memory block BLK1 before the first control signal XCON1 is generated.

In the present disclosure, the programming of the dummy cells DC means a normal program operation executed by applying a program voltage to the dummy cells DC as well as a soft program phenomenon wherein threshold voltages of the dummy cells DC increase without applying the program voltage to the dummy cells DC. Moreover, the programming of the dummy cells DC may be executed in string selection lines SSL or in memory blocks.

Since the second control signal XCON2 is generated earlier than the first control signal XCON1, the dummy cells DC may be programmed before the normal cells NC are programmed. The dummy program controller 144 may receive the program command CMD to generate the second control signal XCON2 before the first control signal XCON1 is generated.

In example embodiments, the dummy program controller 144 may generate the second control signal XCON2 regardless of the program command CMD. For example, the second control signal XCON2 may be generated even while the erasure operation is executed. The erasure operation may be executed in response to an erasure command supplied from an external device or may be executed for garbage collection even without any external commands. The controller 140 may generate the second control signal XCON2 without generation of the first control signal XCON1 when an external erasure command signal is inputted thereto or a garbage collection command is internally generated therein. That is, even though the program command CMD is not inputted to the controller 140, the dummy program controller 144 may generate the second control signal XCON2 for programming the dummy cells DC if an erasure operation of the first memory block BLK1 is executed. In such a case, the second control signal XCON2 may be generated during the erasure operation (e.g., prior to ERS busy return) or after the erasure operation (e.g., after the ERS busy return).

The dummy program controller 144 may generate the second control signal XCON2 to program the dummy cells DC by using a hot carrier injection (HCI) mechanism in order to increase the threshold voltages of the dummy cells DC. Alternatively, the dummy program controller 144 may generate the second control signal XCON2 to program the dummy cells DC using an F-N tunnelling mechanism to increase the threshold voltages of the dummy cells DC. An operation of the dummy program controller 144 will be described more fully later.

The driver 160 may decode the address ADDR to apply the corresponding voltages to the string selection lines SSL1~SSL4, the dummy word line DWL, the normal word lines NWL, the ground selection lines GSL1~GSL4 and the common source line CSL. The driver 160 may receive the first control signal XCON1 to generate a first operation voltage set VOP1 for programming the normal cells of the cell strings which are selected by the address ADDR and may apply the first operation voltage set VOP1 to the first memory block BLK1. In addition, the driver 160 may receive the second control signal XCON2 to generate a second operation voltage set VOP2 for programming the dummy cells DC of the cell strings which are selected by the address ADDR and may apply the second operation voltage set VOP2 to the first memory block BLK1. Each of the first operation voltage set VOP1 and the second operation voltage set VOP2 may include various voltages which are applied to the string selection lines SSL1~SSL4, the dummy word line DWL, the normal word lines NWL and the ground selection lines GSL1~GSL4 of the first memory block BLK1.

In example embodiments, if the second control signal XCON2 for programming the dummy cells DC using a hot carrier injection (HCI) mechanism is inputted to the driver 160, the driver 160 may generate the second operation voltage set VOP2 including a ground voltage applied to the string selection lines SSL1~SSL4 and the ground selection lines GSL1~GSL4, a first pass voltage applied to the dummy word line DWL, and a second pass voltage applied to the normal word lines NWL and may apply the second operation voltage set VOP2 to the first memory block BLK1. Alternatively, if the second control signal XCON2 for programming the dummy cells DC by using an F-N tunnelling mechanism is inputted to the driver 160, the driver 160 may generate the second operation voltage set VOP2 including a power supply voltage applied to the string selection lines SSL1~SSL4, a ground voltage applied to the ground selection lines GSL1~GSL4, a program voltage applied to the dummy word line DWL, and a second pass voltage applied to the normal word lines NWL and may apply the second operation voltage set VOP2 to the first memory block BLK1. A detailed description of the second operation voltage set VOP2 will be developed later.

According to the above description, all of the dummy cells DC in the first memory block BLK1 may be programmed by the first or second control signal XCON1 or XCON2. However, example embodiments are not limited to the above description. For example, the dummy cells DC in the first memory block BLK1 may be partially programmed, as will described with reference to FIG. 19 later. In addition, although not shown in FIG. 1, the memory device 100 may further include a voltage generator for generating various voltages corresponding to the voltages applied to the selection lines SSL1~SSL4 and GSL1~GSL4, the word lines DWL and NWL, and the like. The memory device 100 may further execute a read operation or a garbage collection operation, in addition to the program operation and the erasure operation.

As described above, the string selection transistor SST, the dummy cell DC, the normal cells NC and the ground selection transistor GST included in each cell string may share a single vertical channel body layer with each other. In example embodiments, the channel body layer may be formed of a polysilicon layer using a chemical vapor deposition (CVD) process. In such a case, the channel body layer may have grain boundaries therein and undesired leakage currents may flow through the grain boundaries while the string selection transistor SST, the dummy cell DC, the normal cells NC and the ground selection transistor GST operate. To this end, the three-dimensional memory devices may suffer from a leakage problem (e.g., a leakage current problem or a charge leakage problem) much more than the two dimensional memory devices. Moreover, the leakage current level of each cell string may be different according to the threshold voltages of the string selection transistor and the ground selection transistor and according to characteristics of the grain boundaries.

Figure 8:
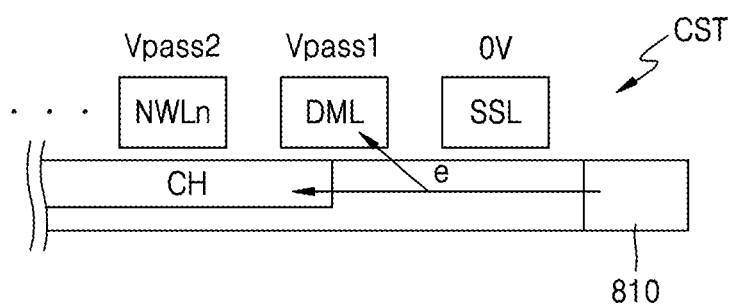
FIG. 8 is a schematic view illustrating a leakage current flowing through an arbitrary string included in the memory cell array of FIG. 2.

FIG. 8 is a schematic view illustrating a leakage phenomenon that occurs in an arbitrary cell string included in the memory cell array 120 of FIG. 2. In the description of FIG. 8, the term "normal cell" may mean a normal word line or vice versa. Similarly, the term "dummy cell" may mean a dummy word line or vice versa, and the term "string selection transistor" may mean a string selection line or vice versa in accordance to a structural nature of the three-dimensional memory device, as illustrated in FIG. 6.

The terminology "cell string CST or CST1~CST4" used hereinafter may denote one of the cell strings CS11~CS41 and CS12~CS42 illustrated in FIG. 3. If the cell string CS11 illustrated in FIG. 3 is selectively programmed by the program command CMD shown in FIG. 1, the programmed cell string CS11 may be referred to as a selected cell string and the remaining cell strings CS21~CS41 and CS12~CS42 may be referred to as non-selected cell strings. The cell string CST of FIG. 8 representatively illustrates a phenomenon that occurs in one of the non-selected cell strings CS21~CS41 and CS12~CS42 or in all of the non-selected cell strings CS21~CS41 and CS12~CS42.

The leakage phenomenon illustrated in FIG. 8 will be described more fully hereinafter. If a ground voltage is applied to the string selection line SSL of the cell string CST, the cell string CST may correspond to a non-selected cell string. As illustrated in FIG. 3, the dummy word line DWL may be connected to all of the dummy cells DC of the first memory block BLK1, and each of the normal word lines NWL may be connected to all of the normal cells NC disposed at the same level (e.g., at the same height). Thus, a first pass voltage Vpass1 may be applied to the dummy word line DWL of the FIG. 8, and a second pass voltage Vpass2 may be applied to the normal word line NWLn of FIG. 8. Alternatively, although not shown in FIG. 8, if the cell string CST of FIG. 8 includes an additional normal word line connected to normal cells of a selected cell string, a program voltage may be applied to the additional normal word line. A bit line voltage may be applied to a contact plug 810 (corresponding to the drain region 320 of FIG. 6) connected to an end of the cell string CST. Thus, the cell string CST may have a ground voltage level. Under the above voltage condition, channel regions CH adjacent to the normal word lines NWL may be electrically isolated to be self-boosted.

Meanwhile, an error rate relating to a specific normal word line may remarkably increase according to a voltage level of the first pass voltage Vpass1. If a level of the first pass voltage Vpass1 is lowered, an error rate relating to the normal word lines adjacent to the string selection line SSL may increase. On the contrary, if the level of the first pass voltage Vpass1 is increased, an error rate relating to the normal word lines adjacent to the ground selection line GSL may increase. In such a case, the first pass voltage Vpass1 may be 7 volts, and the second pass voltage Vpass2 may be 9 volts.

The program operation may be sequentially executed from the normal cell immediately adjacent to the ground selection line GSL toward the normal cell immediately adjacent to the string selection line SSL. In such a case, if the level of the first pass voltage Vpass1 is relatively low, the channel region CH of the normal cell NC connected to at least one normal word line NWL adjacent to the string selection line SSL may not be sufficiently boosted. Thus, an error rate relating to the corresponding normal word line may increase. That is, if the channel region CH of the normal cell NC connected to at least one normal word line NWL is not sufficiently boosted, a potential difference between the channel region CH and the normal word line may increase, thereby causing an error when the corresponding normal cell NC is undesirably programmed.

In contrast, if the level of the first pass voltage Vpass1 is relatively high, a band to band tunneling (BTBT) phenomenon due to a gate induced drain leakage (GIDL) effect may occur in the dummy cell DC, thereby causing a charge leakage problem, as illustrated in FIG. 8. Accordingly, channel regions of the normal cells NC connected to at least one normal word line adjacent to the ground selection line GSL located to be far from the dummy cell DC may not be sufficiently boosted. Thus, the same error as described above may also occur. However, since the program operation of the first memory block BLK1 may be sequentially executed from the normal cell connected to the first normal word line WL1, the program operation may be normally performed after an arbitrary normal word line because the charges introduced into the dummy cell DC due to the BTBT phenomenon program the dummy cell DC with a hot carrier injection (HCI) effect and the threshold voltage of the programmed dummy cell DC increases so that a leakage phenomenon occurring in the dummy cell DC is suppressed.

As a result, the threshold voltage of the dummy cell DC may be optimized. However, because the erasure operation of the dummy cell DC is executed to ensure an erasure speed of the normal cells connected to the normal word line NWLn adjacent to the dummy word line DWL, it may be difficult for the dummy cell DC to maintain the optimized threshold voltage. According to the memory device or the operation method of the memory device in accordance with example embodiments of inventive concepts, the dummy cell DC may be intentionally programmed to suppress the leakage phenomenon from occurring in the cell string CST. A method of operating the memory device according to example embodiments of inventive concepts will be described more fully hereinafter.

Figure 9:
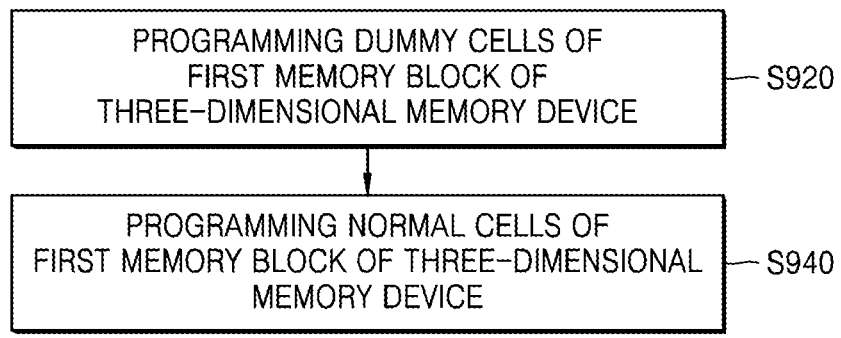
FIG. 9 is a flowchart illustrating a method of operating a memory device according to example embodiments of inventive concepts.

FIG. 9 is a flowchart illustrating a method of operating the memory device according to example embodiments of inventive concepts. Referring to FIGS. 1, 2, 3, and 9, according to example embodiments of inventive concepts, a method of operating the three-dimensional memory device 100 may include a step of programming the dummy cells DC of the first memory block BLK1 of the three-dimensional memory device 100 (see step S920) and a step of programming the normal cells NC of the first memory block BLK1 of the three-dimensional memory device 100 after programming the dummy cells DC of the first memory block BLK1 of the three-dimensional memory device 100 (see step S940).

Figure 10:
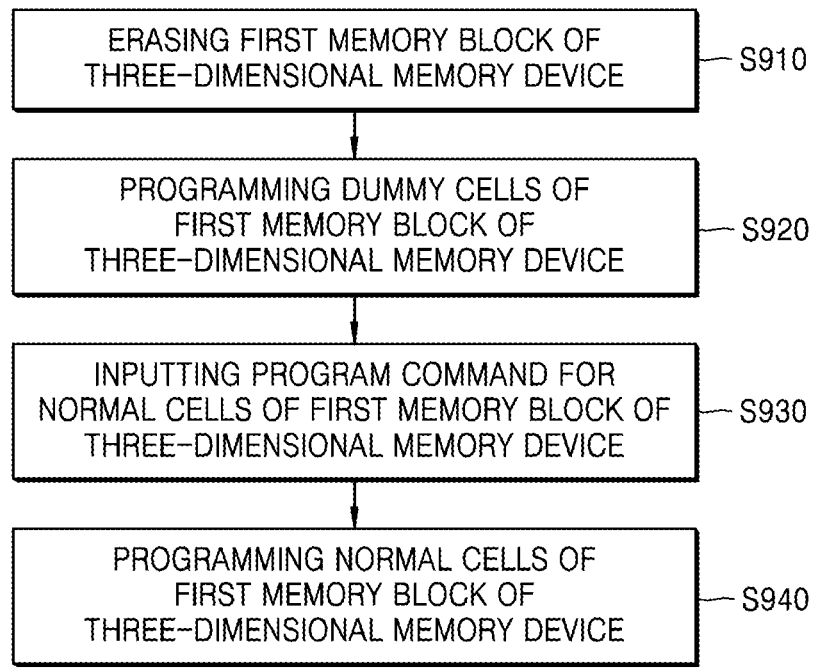
FIGS. 10 and 11 are flowcharts illustrating examples of the operation method shown in FIG. 9.
Figure 11:
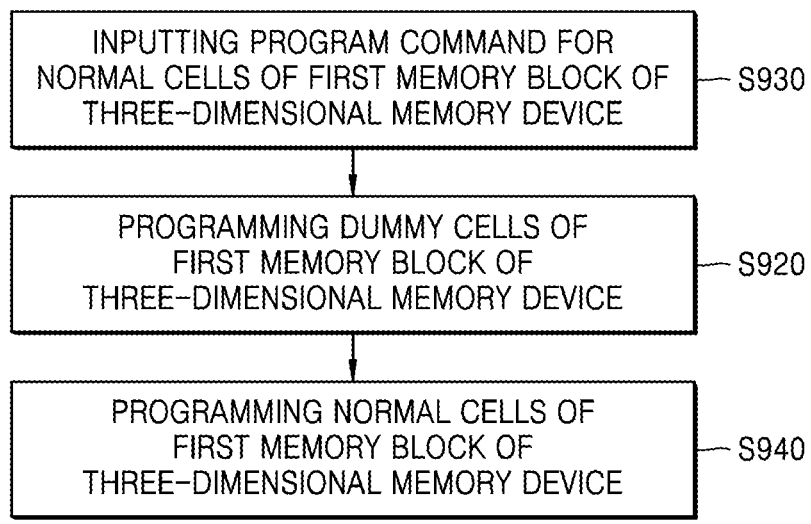

The step of programming the dummy cells DC (S920) may be executed after a step of erasing the first memory block BLK1 of the three-dimensional memory device 100 (see step S910 of FIG. 10), as illustrated in FIG. 10 showing an example of the operation method of FIG. 9. The step of erasing the first memory block BLK1 of the three-dimensional memory device 100 (S910) may be executed in response to an external command (e.g., an erasure command). Alternatively, the step of erasing the first memory block BLK1 (S910) may be accompanied by an internal operation of the memory device 100, for example, a garbage collection operation. If the step of erasing the first memory block BLK1 (S910) is executed, the step of programming the dummy cells DC of the first memory block BLK1 (S920) may then be executed regardless of the input of a program command CMD for programming the normal cells NC of the first memory block BLK1. If the program command CMD for programming the normal cells NC of the first memory block BLK1 is inputted to the controller 140 (see step S930 of FIG. 10) after the dummy cells DC of the first memory block BLK1 are programmed, the normal cells NC of the first memory block BLK1 may be programmed by the program command CMD (see step S940). However, example embodiments are not limited to the method illustrated in FIG. 10. For example, as illustrated in FIG. 11 showing another example of the operation method of FIG. 9, after the program command CMD for programming the normal cells NC of the first memory block BLK1 is inputted to the controller 140 (S930), the step of programming the dummy cells DC of the first memory block BLK1 (S920) may be followed by the step of programming the normal cells NC of the first memory block BLK1 (S940).

A method of programming the dummy cells DC, according to example embodiments, will be described more fully hereinafter with reference to FIGS. 12 and 13.

Figure 12:
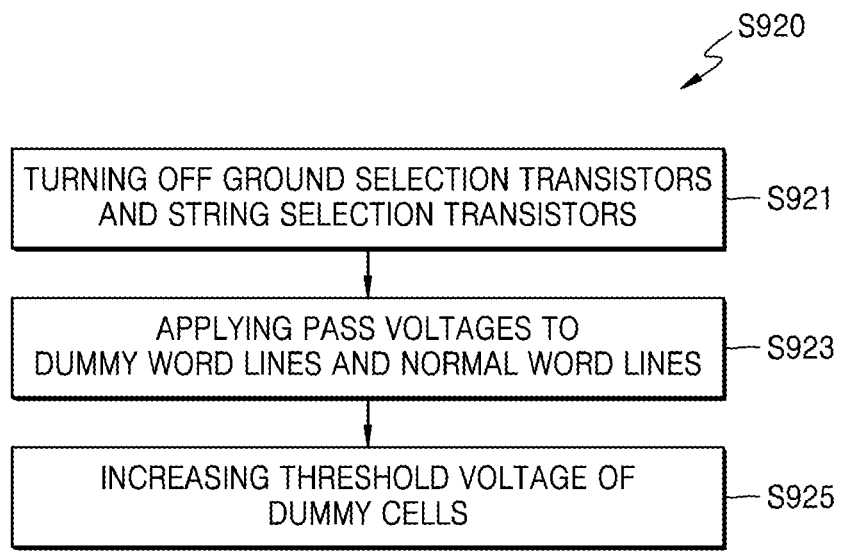
FIG. 12 is a flowchart illustrating a method of increasing a threshold voltage of dummy cells using a hot carrier injection (HCI) mechanism to program the dummy cells.
Figure 13:
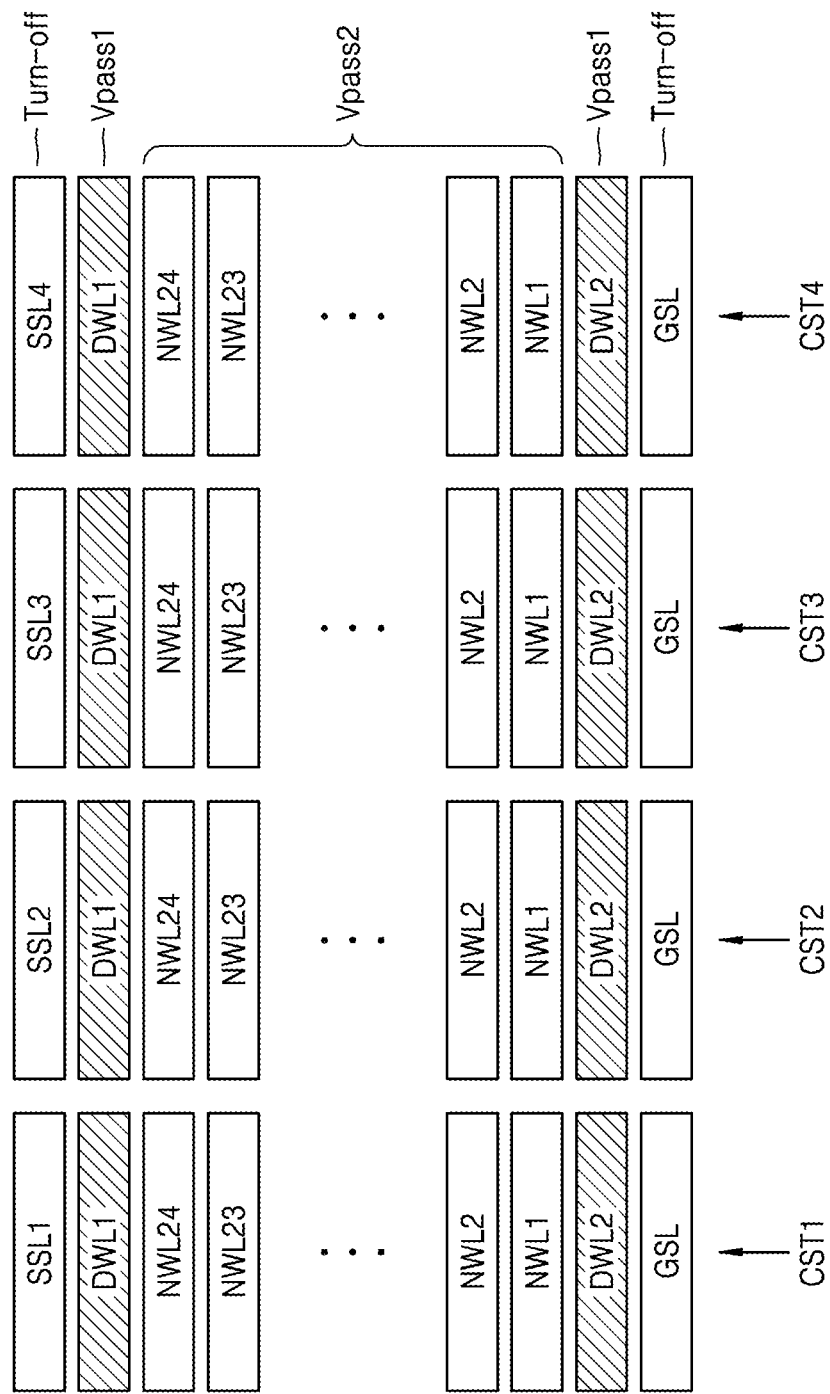
FIG. 13 illustrates a bias condition applied to strings of a memory cell array to program dummy cells using a hot carrier injection (HCI) mechanism.

FIG. 12 is a flowchart illustrating a method of increasing a threshold voltage of dummy cells by using a hot carrier injection (HCI) mechanism to program the dummy cells, and FIG. 13 illustrates a bias condition applied to cell strings CST1~CST4 in the memory cell array 120 to program the dummy cells DC of the cell strings CST1~CST4 using a hot carrier injection (HCI) mechanism.

Referring to FIGS. 1, 2, 3, 12 and 13, the string selection transistors SST and the ground selection transistors GST of the first memory block BLK1 may be turned off (see step S921). For example, a ground voltage may be applied to the string selection lines SSL connected to the string selection transistors SST and the ground selection lines GSL connected to the ground selection transistors GST to turn off the string selection transistors SST and the ground selection transistors GST of the first memory block BLK1. Although FIG. 13 illustrates an example in which the first memory block BLK1 includes four cell strings CST1~CST4, example embodiments are not limited thereto. For example, the first memory block BLK1 may include five or more cell strings. In addition, although FIG. 13 illustrates an example in which each of the cell strings CST1~CST4 includes twenty four normal cells NC (e.g., twenty four normal word lines NWL1~NWL24), a first dummy cell (e.g., a first dummy word line DWL1) adjacent to the string selection lines SSL, and a second dummy cell (e.g., a second dummy word line DWL2) adjacent to the ground selection lines GSL, example embodiments are not limited thereto. The step of turning off the string selection transistors SST and the ground selection transistors GST (S921) may be performed to turn off all of the string selection transistors SST and the ground selection transistors GST in the first memory block BLK1.

Subsequently, a first pass voltage Vpass1 may be applied to all of the dummy word lines DWL, and a second pass voltage Vpass2 may be applied to all of the normal word lines NWL (see step S923). The first past voltage Vpass1 may be different (e.g., lower) than the second pass voltage Vpass2. The first pass voltage Vpass1 may be 9 volts and the second pass voltage Vpass2 may be 10 volts. However, in example embodiments, the first pass voltage Vpass1 may be lower or higher than 9 volts and the second pass voltage Vpass2 may be lower or higher than 10 volts. The dummy cells DC may be strongly or weakly programmed according to voltage levels of the first and second pass voltages Vpass1 and Vpass2. Under the aforementioned bias condition, channel regions of the dummy cells and the normal cells may be self-boosted and threshold voltages of the dummy cells may increase due to a hot carrier injection (HCI) phenomenon (see step S925).

Accordingly, occurrence of a program disturbance phenomenon in the first memory block BLK1 may be reduced and/or suppressed. Thus, even though the first pass voltage Vpass1 has a high level during the following operation for programming the normal cells, the program error rate of the normal cells connected to the normal word line NWL adjacent to the ground selection line GSL may be reduced or occurrence of the program error may be limited (and/or prevented). In such a case, as described above, the amount of charges injected into the dummy cells DC due to the BTBT phenomenon may increase as the leakage characteristic of the cell string CST including the corresponding dummy cell DC becomes worse.

Accordingly, because a threshold voltage of a dummy cell of a cell string CST having a poor leakage characteristic becomes relatively higher than a threshold voltage of a dummy cell of a cell string having an excellent leakage characteristic, the normal cells of all of the cell strings may be uniformly programmed during the operation for programming the normal cells even though the leakage characteristics of the cell strings are non-uniform. As a result, overall operations of the memory device 100 may be more readily controlled to improve the reliability of the memory device 100. According to the above description, all of the dummy cells in the first memory block BLK1 may be programmed. However, example embodiments are not limited thereto. For example, in example embodiments, only cell strings having a poor leakage characteristic may be detected and the dummy cell program operation as described above may be applied only to the detected cell strings having a poor leakage characteristic.

Figure 14:
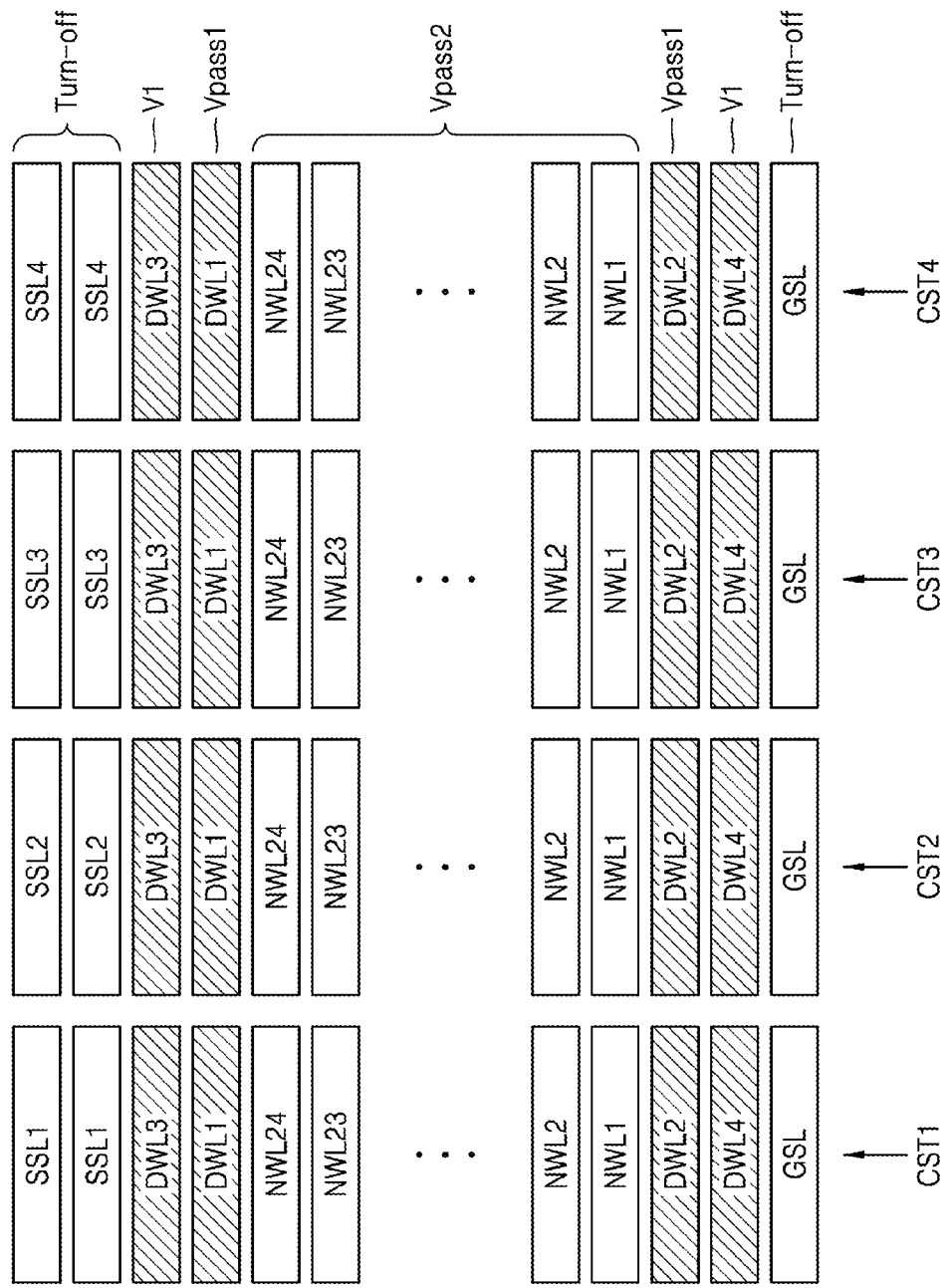
FIG. 14 illustrates another bias condition applied to strings of a memory cell array to program dummy cells.

FIG. 14 illustrates another bias condition applied to the cell strings of the first memory block to program the dummy cells of the first memory block. Referring to FIG. 14, the first memory block may include four dummy word lines DWL1~DWL4 unlike the method described previously with reference to FIG. 13. The first dummy word line DWL1 may be disposed to be immediately adjacent to the uppermost normal word line NWL24, and the second dummy word line DWL2 may be disposed to be immediately adjacent to the lowermost normal word line NWL1. The third dummy word line DWL3 may be disposed between the first dummy word line DWL1 and the string selection line SSL, and the fourth dummy word line DWL4 may be disposed between the second dummy word line DWL2 and the ground selection line GSL. Moreover, the first memory block of FIG. 14 may include two layers of string selection lines unlike the method described previously with reference to FIG. 13. The reason for increasing the number of the string selection lines and the number of the dummy word lines is to improve the operation characteristics of the three-dimensional memory device 100.

Figures 15, 16:
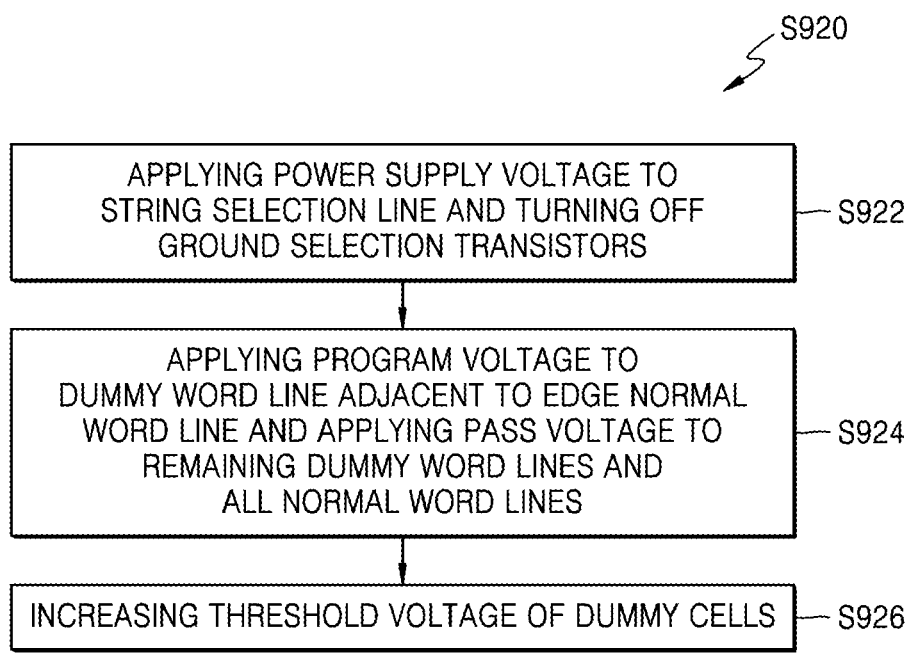
FIG. 15 is a table illustrating voltages applied to a first memory block of FIG. 14.
FIG. 16 is a flowchart illustrating a method of programming dummy cells using a Fowler-Nordheim (FN) tunneling mechanism.

FIG. 15 is a table illustrating voltages applied to the first memory block of FIG. 14. Referring to FIG. 15, the same voltages as described with reference to FIG. 13 may be applied to the string selection lines SSL, the ground selection line GSL, the normal word lines NWL1~NWL24, and the first and second dummy word lines DWL1 and DWL2. More specifically, a ground voltage may be applied to all of the string selection lines SSL, and a first pass voltage Vpass1, for example, 9 volts may be applied to both the first and second dummy word lines DWL1 and DWL2. A second pass voltage Vpass2, for example, 10 volts may be applied to all of the normal word lines NWL1~NWL24, and a ground voltage may be applied to the ground selection line GSL.

In addition, a voltage lower than the first pass voltage Vpass1 may be applied to the third and fourth dummy word lines DWL3 and DWL4. For example, the voltage V1 may be 3 volts, but is not limited thereto. When the first and second dummy word lines DWL1 and DWL2 (e.g., the dummy cells connected to the first and second dummy word lines DWL1 and DWL2) are erased to limit (and/or prevent) degradation of the erasure speed of the normal word lines (e.g., the normal cells), the third and fourth dummy lines DWL3 and DWL4 (e.g., the dummy cells connected to the third and fourth dummy lines DWL3 and DWL4) may not be erased and thus the string selection lines SSL (e.g., the string selection transistors SST) and the ground selection line GSL (e.g., the ground selection transistors GST) are not influenced by the erasure operation of the first and second dummy word lines DWL1 and DWL2. In this connection, when the first and second dummy word lines DWL1 and DWL2 are programmed by using a hot carrier injection (HCI) mechanism, a voltage lower than the first pass voltage Vpass1 may be applied to the third and fourth dummy word lines DWL3 and DWL4 to limit (and/or prevent) the third and fourth dummy word lines DWL3 and DWL4 from being programmed.

Figure 17:
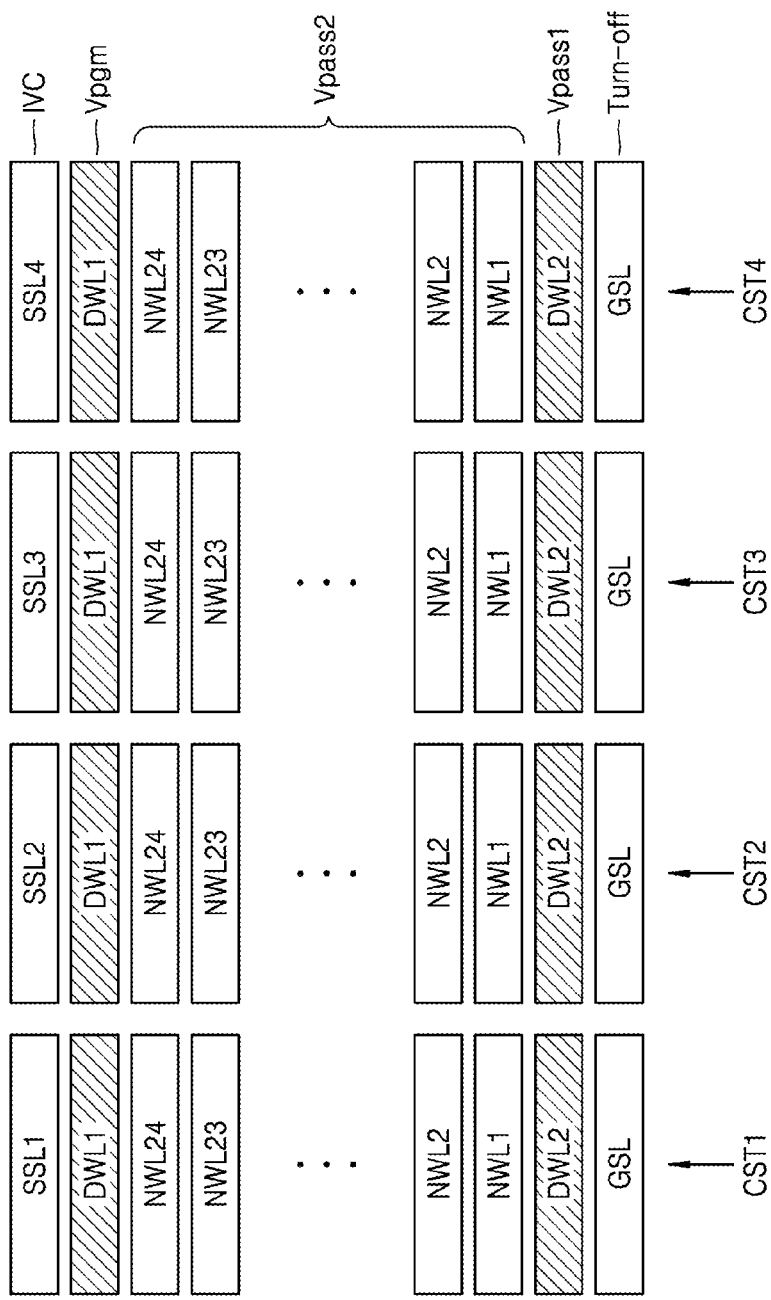
FIG. 17 illustrates a bias condition applied to strings of a memory cell array to program dummy cells by using a Fowler-Nordheim (F-N) tunneling mechanism.

FIG. 16 is a flowchart illustrating a method of programming dummy cells using a Fowler-Nordheim (FN) tunneling mechanism according to example embodiments, and FIG. 17 illustrates a bias condition applied to cell strings of a first memory block to program the dummy cells by using a Fowler-Nordheim (F-N) tunneling mechanism according to example embodiments.

Referring to FIGS. 1, 2, 3, 16, and 17, a first voltage IVC may be applied to the string selection lines SSL of the first memory block and the ground selection transistors GST may be turned off (see step S922). The first voltage IVC may be a voltage that is applied to the string selection lines SSL during a program operation. For example, the first voltage IVC may be a power supply voltage VCC.

In example embodiments, a ground voltage may be applied to the ground selection lines GSL to turn off the ground selection transistors GST connected to the ground selection lines GSL. Furthermore, a program voltage Vpgm may be applied to the first dummy word line DWL1 which is adjacent to an edge normal word line (e.g., an uppermost normal word line NWL24 of the plurality of normal word lines NWL), and a first pass voltage Vpass1 and a second pass voltage Vpass2 may be applied to the remaining dummy word lines (e.g., the second dummy word line DWL2) and all of the normal word lines NWL1~NWL24, respectively (see step S924). The program voltage Vpgm may be equal to or higher than 15 volts, and the first and second pass voltages Vpass1 and Vpass2 may be 9 volts. However, example embodiments are not limited thereto. For example, in example embodiments, the program voltage Vpgm may be lower than 15 volts, or the first and second pass voltages Vpass1 and Vpass2 may be lower or higher than 9 volts. Under the aforementioned bias condition, all of the dummy cells may be programmed by an F-N tunnelling mechanism to increase of the threshold voltages of the dummy cells (see step S926).

Accordingly, occurrence of a program disturbance phenomenon in the first memory block BLK1 may be suppressed. Thus, even though the first pass voltage Vpass1 has a high level during the following operation for programming the normal cells, the program error rate of the normal cells connected to the normal word line NWL adjacent to the ground selection line GSL may be reduced or occurrence of the program error may be limited (and/or prevented). That is, the occurrence of a leakage phenomenon illustrated in FIG. 8 may be limited (and/or prevented) because the first pass voltage Vpass1 higher than the threshold voltages of the dummy cells is applied to the second dummy word line DWL2. Thus, the program disturbance phenomenon may be effectively suppressed.

Figures 18B, 19:
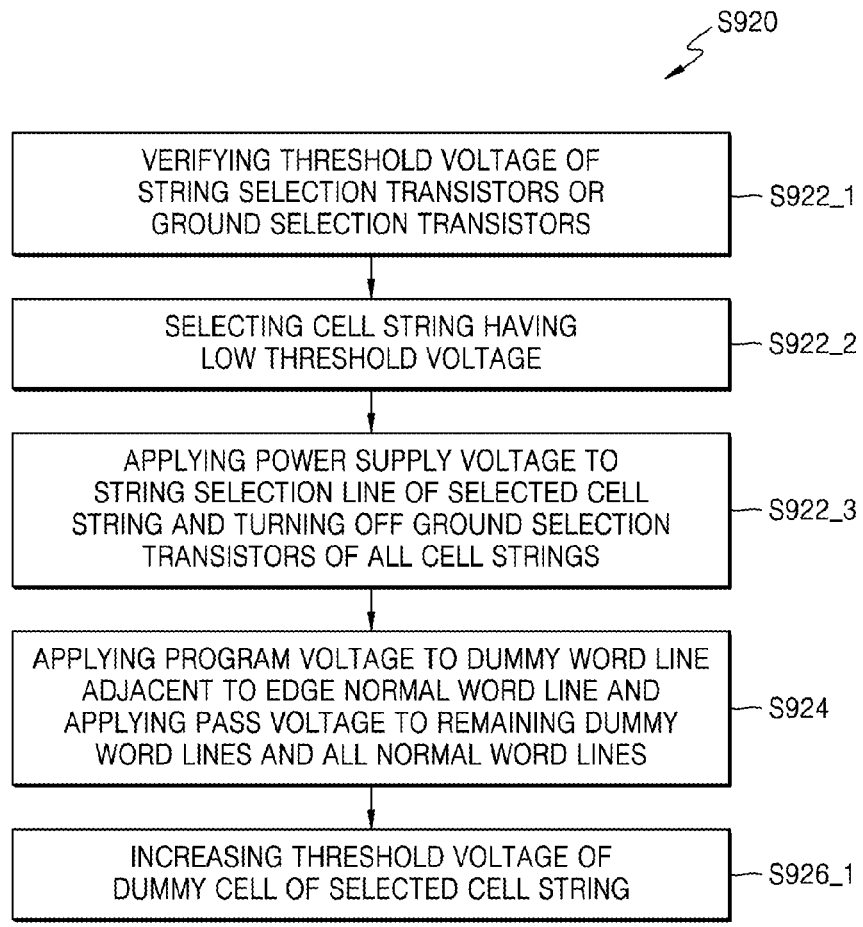
FIG. 18B is a table illustrating voltages applied to a first memory block of FIG. 18A.
FIG. 19 is a flowchart illustrating a dummy cell program method according to example embodiments that may be included in the operation method of FIG. 9.

FIG. 18A illustrates a bias condition applied to the cell strings of the first memory block having a different structure from the cell strings of FIG. 17 in order to program the dummy cells of the first memory block. Referring to FIG. 18A, the first memory block may include four dummy word lines DWL1~DWL4, unlike the method described previously with reference to FIG. 17. That is, the first dummy word line DWL1 may be disposed to be immediately adjacent to the uppermost normal word line NWL24, and the second dummy word line DWL2 may be disposed to be immediately adjacent to the lowermost normal word line NWL1. The third dummy word line DWL3 may be disposed between the first dummy word line DWL1 and the string selection line SSL, and the fourth dummy word line DWL4 may be disposed between the second dummy word line DWL2 and the ground selection line GSL. Moreover, the first memory block of FIG. 19 may include two layers of string selection lines, unlike the method described previously with reference to in FIG. 17.

Referring to FIG. 18B showing voltages applied to the first memory block illustrated in FIG. 18A, the same voltages as described with reference to FIG. 17 may be applied to the string selection lines SSL, the ground selection line GSL, the normal word lines NWL1~NWL24, and the first and second dummy word lines DWL1 and DWL2. More specifically, a first voltage IVC may be applied to the string selection lines SSL, first and second pass voltages Vpass1 and Vpass2 of 9 volts may be applied to the second dummy word line DWL2 and the normal word lines NWL1~NWL24, a program voltage Vpgm of 15 volts may be applied to the first dummy word line DWL1, and a ground voltage may be applied to the ground selection lines GSL. In addition, a voltage lower than the first pass voltage Vpass1, for example, 3 volts may be applied to the third and fourth dummy word lines DWL3 and DWL4.

FIG. 19 is a flowchart illustrating a dummy cell program method according to example embodiments. Referring to FIGS. 1, 2, 3, 17, and 19, only the dummy cells of the cell strings having a poor leakage characteristic may be selectively programmed, unlike the method described previously with reference to FIG. 16. In this connection, threshold voltages of the string selection transistors SST or the ground selection transistors GST in the first memory block BLK1 may be verified (see step S922_1). The threshold voltages of the string selection transistors SST or the ground selection transistors GST in the first memory block BLK1 may be detected or verified using a desired (and/or alternatively predetermined) threshold voltage window.

Subsequently, at least one cell string including the string selection transistor or the ground selection transistor whose threshold voltage is lower than a first reference voltage may be selected (see step S922_2). Then, a power supply voltage IVC may be applied to the string selection line SSL connected to the selected cell string, and all of the ground selection transistors GST of the first memory block BLK1 may be turned off by applying a ground voltage to the ground selection line GSL (see step of S922_3). In such a case, the string selection lines SSL connected to non-selected cell strings may be grounded.

Next, a program voltage Vpgm may be applied to the first dummy word line DWL1 which is adjacent to an edge normal word line (e.g., an uppermost normal word line NWL24 of the plurality of normal word lines NWL), a first pass voltage Vpass1 may be applied to the remaining dummy word lines (e.g., the second dummy word line DWL2), and a second pass voltage Vpass2 may be applied to all of the normal word lines NWL1~NWL24 (see step S924). The program voltage Vpgm may be equal to or higher than 15 volts, and the first and second pass voltages Vpass1 and Vpass2 may be 9 volts. However, example embodiments are not limited thereto. For example, in example embodiments, the program voltage Vpgm may be lower than 15 volts, or the first and second pass voltages Vpass1 and Vpass2 may be lower or higher than 9 volts. Under the aforementioned bias condition, only the dummy cells of the selected cell string may be selectively programmed by an F-N tunnelling mechanism to increase the threshold voltages of only the dummy cells of the selected cell string (see step S926_1).

The dummy cell program operations described above, for example, the step S920 of FIG. 9 may be performed once before the normal cell program operation (e.g., the step S940 of FIG. 9) is performed in response to the program command CMD illustrated in FIG. 1. However, example embodiments are not limited thereto. For example, in example embodiments, the dummy cell program operation may be executed at least twice before the normal cell program operation is performed. The number of times that the dummy cell program operation is executed may be different according to a level of a voltage applied to the first dummy word line DWL1 and a level of a voltage applied to the plurality of normal word lines NWL1~NWL24. For example, if the voltage applied to the dummy word lines and the voltage applied to the plurality of normal word lines increase, the number of times that the dummy cell program operation is executed may be reduced.

Figure 20:
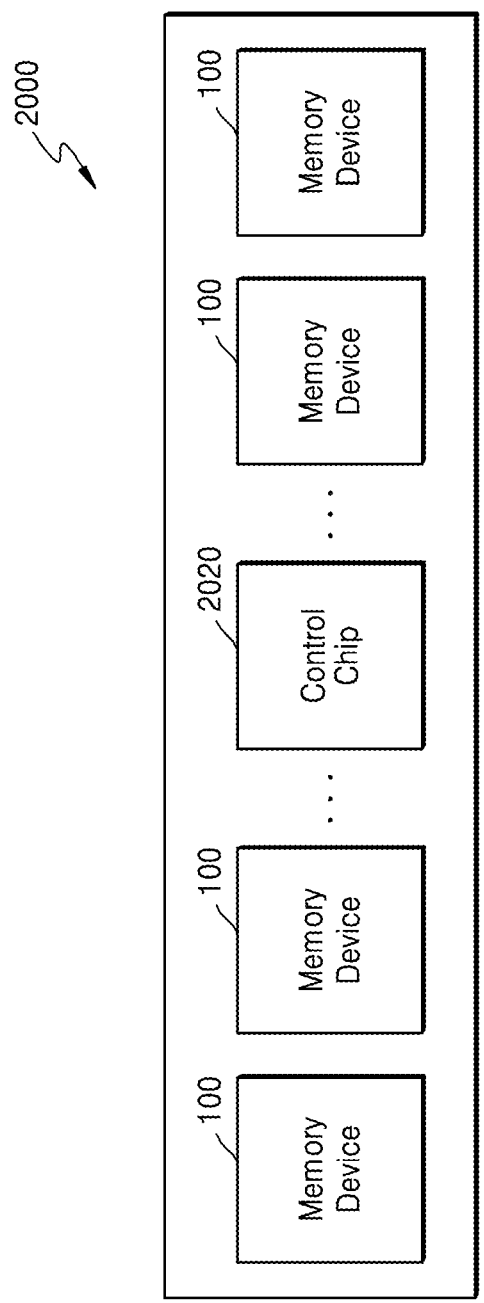
FIG. 20 is a block diagram illustrating a memory module including memory devices according to example embodiments of inventive concepts.

FIG. 20 is a block diagram illustrating a memory module 2000 including the memory devices 100 according to example embodiments of inventive concepts. Referring to FIG. 20, the memory module 2000 may include a plurality of memory chips 100 and a control chip 2020. Each of the memory chips 100 may be configured to store data. For example, each of the memory chips 100 may be the memory device 100 shown in FIG. 1. The control chip 2020 may control operations of the memory chips 100 in response to various signals generated and outputted from an external memory controller. For example, the control chip 2020 may activate at least one of the memory chips 100, which is selected by a chip selection signal supplied from an external device. Moreover, the control chip 2020 may execute an error check and correction operation of data which are read out of each memory chip 100.

Figure 21:
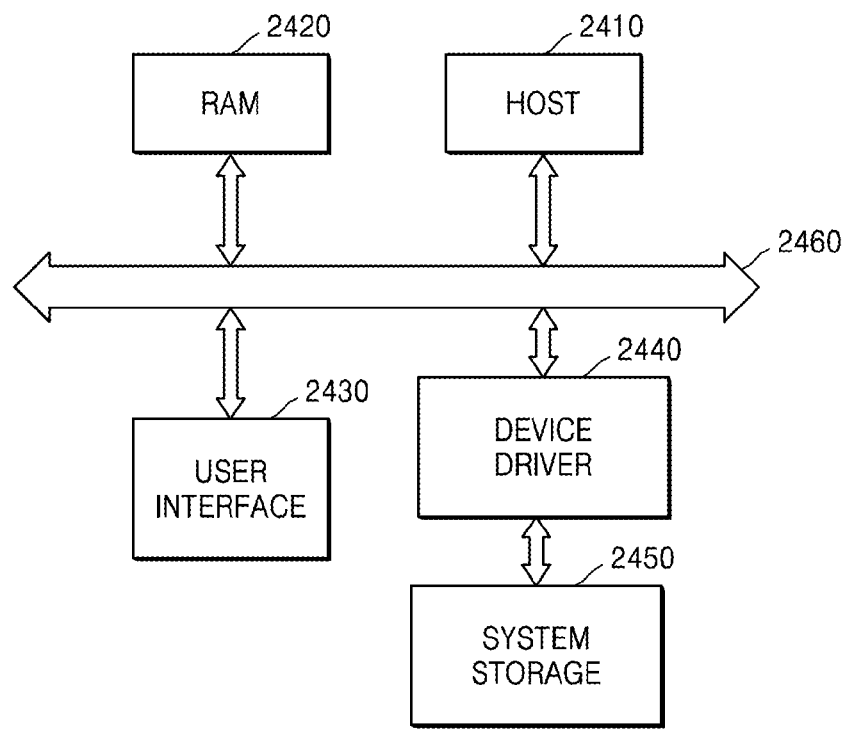
FIG. 21 is a block diagram illustrating a computing system including a nonvolatile memory system according to example embodiments of inventive concepts.

FIG. 21 is a block diagram illustrating a computing system 2400 including a nonvolatile memory system according to example embodiments of inventive concepts. Referring to FIG. 21, the computing system 2400 may be a mobile system or a desktop computer. The computing system 2400 may include a host 2410 having a central processing unit (CPU), a random access memory (RAM) 2420, a user interface 2430, and a device driver 2440 that communicate with each other through a bus 2460. The central processing unit (CPU) of the host 2410 may be hardware. The computing system 2400 may further include a nonvolatile memory device 2450 which is connected to the device driver 2440. The host 2410 may control overall operations of the computing system 2400 and may execute logical operations corresponding to user's commands inputted though the user interface 2430 or may process data inputted though the user interface 2430. The RAM 2420 may function as a data memory of the host 2410, and the host 2410 may write user's data in the nonvolatile memory device 2450 through the device driver 2440 or may read out the data stored in the nonvolatile memory device 2450 through the device driver 2440. Although FIG. 21 illustrates an example in which the device driver 2440 for controlling the nonvolatile memory device 2450 is physically separated from the host 2410, but example embodiments are not limited thereto. That is, the device driver 2440 may be included in the host 2410. The nonvolatile memory device 2450 may include the memory device 100 shown in FIG. 1.

Figure 22:
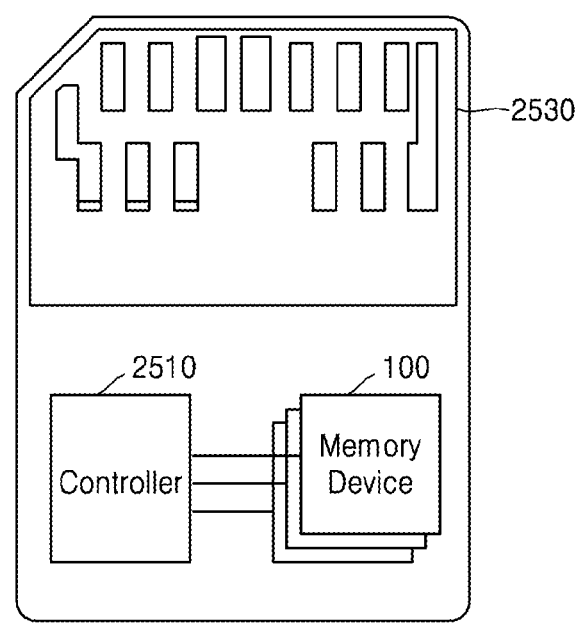
FIG. 22 is a schematic view illustrating a memory card including memory devices according to example embodiments of inventive concepts.

FIG. 22 is a schematic view illustrating a memory card 2500 according to example embodiments of inventive concepts. The memory card 2500 may be used as a portable storage medium which can be connected to an electronic system such as a mobile system or a desktop computer. As illustrated in FIG. 22, the memory card 2500 may include memory devices 100, a memory controller 2510, and a port region 2530. The memory card 2500 may communicate with an external host (not shown) through the port region 2530, and the memory controller 2510 may control the memory devices 100. The memory controller 2510 may read out various programs stored in a read only memory (ROM) (not shown) and may execute commands of the programs.

Figure 23:
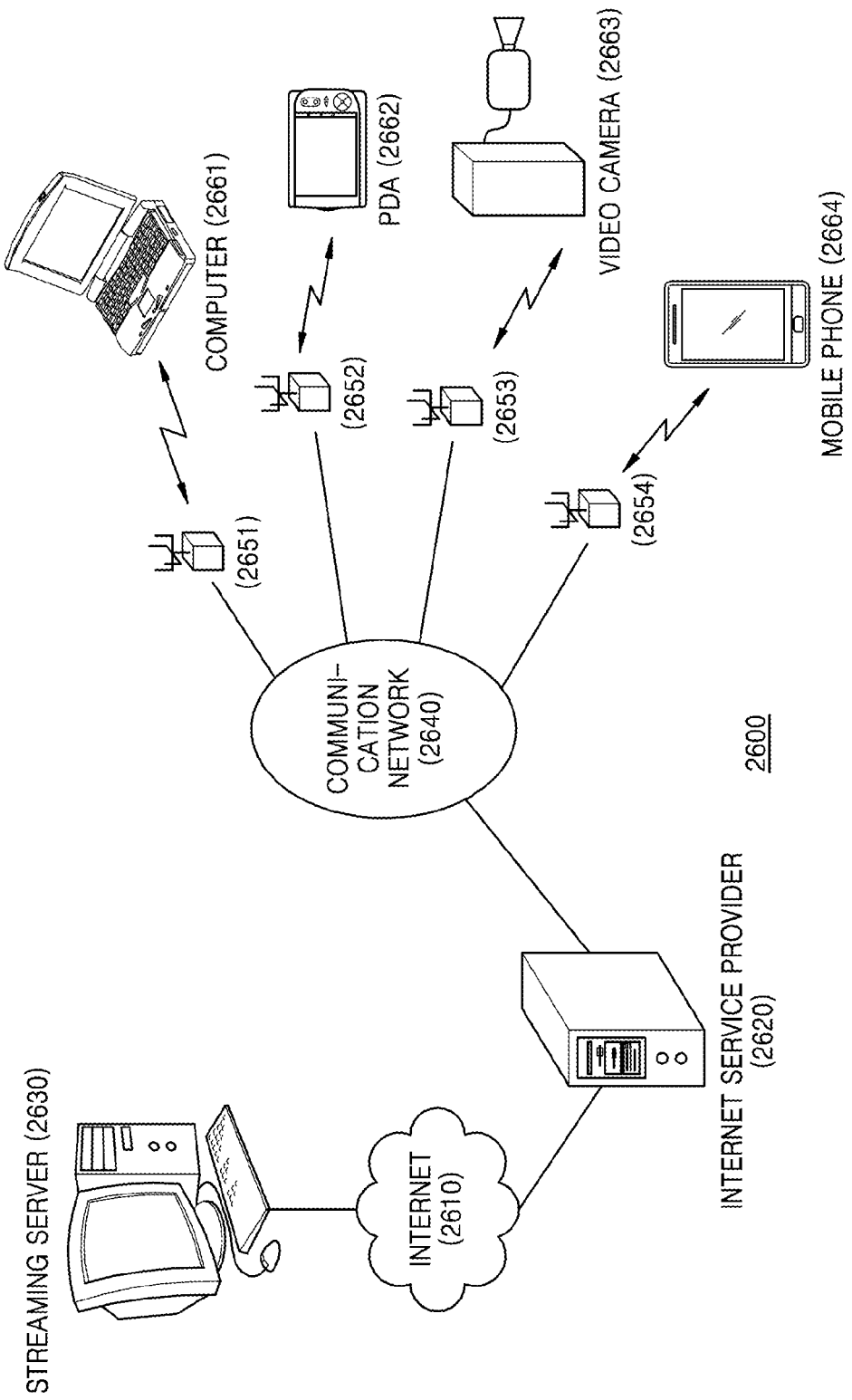
FIG. 23 is a schematic view illustrating a system of transmitting and receiving contents including a memory device according to example embodiments of inventive concepts.

FIG. 23 is a schematic view illustrating a system 2600 of transmitting and receiving contents, the system 2600 including a memory device according to example embodiments of inventive concepts. The system 2600 may include a plurality of independent and separate devices. For example, independent devices such as a computer 2661, a personal digital assistant (PDA) 2662, a camera 2663 and a mobile phone 2664 may be connected to internet 2610 through an internet service provider 2620, a communication network 2640, and wireless base stations 2651~2654. A memory system according to example embodiments may be included in each of the independent devices 2661~2664 of the system 2600. For example, each of the computer 2661, the PDA 2662, the camera 2663, and the mobile phone 2664 may include the memory device 100 described previously with reference to FIG. 1. A streaming server 2630 may be connected to the internet 2610.

The system 2600 is not limited to the example illustrated in FIG. 23. For example, the independent devices 2661~2664 may be directly connected to the communication network 2640 without using the wireless base stations 2651~2654. The camera 2663 may be a digital video camera. The mobile phone 2664 may employ at least one of various protocols such as a personal digital communications (PDC) technique, a code division multiple access (CDMA) technique, a wideband code division multiple access (W-CDMA) technique, a global system for mobile communications (GSM) technique, and a personal handy phone system (PHS) technique.

Figure 24:
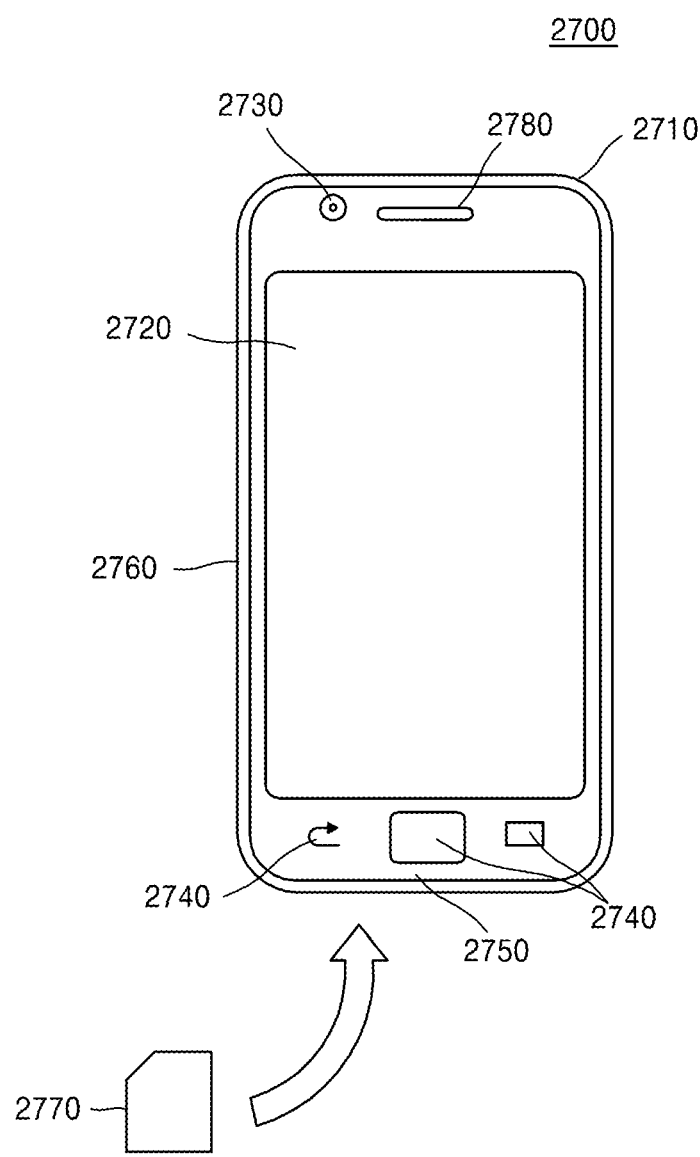
FIG. 24 illustrates a mobile terminal including a memory device according to example embodiments of inventive concepts.

FIG. 24 shows a mobile terminal 2700 including a memory system according to example embodiments of inventive concepts. The mobile terminal 2700 may correspond to the mobile phone 2664 shown in FIG. 23 and may include the memory device 100 shown in FIG. 1. The mobile terminal 2700 may have unlimited (or customizable) functions. That is, the functions of the mobile terminal 2700 may be expanded or changed by using various application programs. The mobile terminal 2700 may include an internal antenna 2710 for exchanging frequency signals (e.g., radio frequency RF signals) with wireless base stations. The mobile terminal 2700 may further include a display unit 2720 such as a liquid crystal display (LCD) unit or an organic light emitting diode (OLED) display unit. The display unit 2720 may display video images which are captured by a camera 2730 or video images which are received through the internal antenna 2710 and decoded by an image processor. The mobile terminal 2700 may further include operation panels 2740 having a control button and touch panels. If the display unit 2720 is a touch screen, the operation panels 2740 may further include a touch sense panel of the display unit 2720. The mobile terminal 2700 may further include a speaker 2780 and a microphone 2750. In addition, the mobile terminal 2700 may include the camera 2730. Moreover, the mobile terminal 2700 may be configured to include a storage medium 2770 for storing video images or still pictures which are captured by the camera 2730 or received through e-mails. The mobile terminal 2700 may further include a slot 2760 for connecting the storage medium 2770 thereto. The storage medium 2770 may include the memory device 100 shown in FIG. 1.

While some example embodiments have been particularly shown and described, it will be understood by one of ordinary skill in the art that variations in form and detail may be made therein without departing from the spirit and scope of the claims.

What is claimed is:

1. A method of operating a memory device including a first memory block having a plurality of cell strings, each of the plurality of cell strings including a string selection transistor connected in series to a first dummy cell, a plurality of normal cells, a second dummy cell and a ground selection transistor, the method comprising:
   programming the first dummy cell; and
   programming the normal cells in at least one of the plurality of cell strings after the programming the first dummy cell, the normal cells being selected based on a first program command inputted to the memory device, wherein
   the programming the first dummy cell is performed at least twice before the normal cells are programmed, and
   a number of times of programming the first dummy cell is different according to a level of a voltage applied to the first dummy cell and a level of a voltage applied to the plurality of normal cells.

2. The method of claim 1, wherein the programming the first dummy cell is performed in response to the first program command or the programming the first dummy cell is performed after performing an erasure operation on the first memory block regardless of the first program command being inputted to the memory device.

3. The method of claim 1, wherein the programming the first dummy cell includes:
   programming the first dummy cell;
   applying a ground voltage to the string selection transistor and the ground selection transistor;
   applying a first pass voltage to the first and second dummy cells; and
   applying a second pass voltage to the plurality of normal cells.

4. The method of claim 1, wherein the programming the first dummy cell includes:
   applying a first voltage to the string selection transistor;
   applying a ground voltage to the ground selection transistor;
   applying a program voltage to the first dummy cell; and
   applying a pass voltage to the second dummy cell and the plurality of normal cells.

5. The method of claim 4, wherein
   each of the plurality of cell strings further includes a third dummy cell between the string selection transistor and the first dummy cell,
   each of the plurality of cell strings further includes a fourth dummy cell between the ground selection transistor and the second dummy cell; and the programming the first dummy cell further includes applying a voltage lower than the pass voltage to the third and fourth dummy cells.

6. The method of claim 1, wherein the programming the first dummy cell is selectively performed on at least one cell string if a threshold voltage of the string selection transistor or the ground selection transistor in the at least one cell string is lower than a first reference voltage.

7. The method of claim 1, further comprising:
erasing the first memory block after the normal cells are programmed; and
reprogramming the first dummy cell, wherein the reprogramming of the first dummy cell is performed using a voltage different from a program voltage which is applied to the first dummy cell in programming the first dummy cell.

8. The method of claim 7, further comprising:
programming the normal cells in at least one cell string selected by a second program command additionally inputted to the memory device after the first dummy cells are reprogrammed,
wherein the programming of the normal cells in the at least one cell string selected by the second program command is performed using a voltage different from a voltage that is used in the programming the normal cells of the at least one cell string selected by the first program command.

9. The method of claim 1, wherein the memory device includes a memory cell array, a controller, and a driver,
the memory cell array includes the first memory block,
the programming the first dummy cell includes increasing a threshold voltage of at least one dummy cell in at least one of the plurality of cell strings in the first memory block, and
the programming the normal cells includes programming the normal cells in a selected string among the plurality of cell strings after the increasing the threshold voltage of the at least one dummy cell.

10. The method of claim 9, wherein
the increasing the threshold voltage of the at least one dummy cell includes using one of a hot carrier injection (HCI) mechanism and a Fowler-Nordheim (F-N) tunneling mechanism to program the at least one dummy cell before the programming the plurality of normal cells, and
the at least one dummy cell includes the first dummy cell and the second dummy cell in the at least one of the plurality of cell strings.

11. The method of claim 10, wherein
the HCI mechanism is used during the increasing the threshold voltage of the at least one dummy cell, and
the HCI mechanism includes,
turning the string selection transistor and the ground selection transistor off in the at least one of the plurality of cell strings,
applying a first pass voltage to the first dummy cell and the second dummy cell in the at least one of the plurality of cell strings, and
applying a second pass voltage to the plurality of normal cells in the at least one of the plurality of cell strings, wherein
the second pass voltage is greater than the first pass voltage.

12. The method of claim 11,
the F-N tunneling mechanism is used during the increasing the threshold voltage of the at least one dummy cell, and the F-N tunneling mechanism includes turning the ground selection transistor off in the at least one of the plurality of cell strings,
applying a first voltage to the string selection transistor in the at least one of the plurality of cell strings,
applying a program voltage to the first dummy cell in the at least one of the plurality of cell strings,
applying a first pass voltage to the second dummy cell in the at least one of the plurality of cell strings, and
applying a second pass voltage to the plurality of normal cells in the at least one of the plurality of cell strings, wherein
a value of the first pass voltage is greater than a value of a ground voltage and less than a value of the program voltage,
a value of the second pass voltage is greater than the value of the ground voltage and less than the value of the program voltage, and
the first voltage is a power supply voltage.

13. The method of claim 9, wherein,
in each of the plurality of cell strings,
the second dummy cell is on top of the ground selection transistor, the plurality of normal cells are on top of the second dummy cell, the first dummy cell is on top of the plurality of normal cells, and the string selection transistor is on top of the first dummy cell,
the programming the plurality of normal cells in the selected string is performed in response to a program command received by the controller, a control signal generated by the controller and transferred to the driver in response to the program command, and an address decoded by the driver,
the programming the plurality of normal cells in the selected string includes the driver applying an operation voltage set to the selected string in response to the control signal transferred to the driver by the controller, and
the increasing the threshold voltage of the at least one dummy cell is performed in response to the controller receiving the program command, or
the increasing the threshold voltage of the at least one dummy cell is performed after performing an erasure operation on the first memory block regardless of the controller receiving the program command.

14. The method of claim 1, wherein an erase operation on the first memory block is not performed between the programming the first dummy cell and the programming the normal cells in at least one of the plurality of cell strings after programming the first dummy cell.

15. The method of claim 1, wherein the programming the first dummy cell is performed after performing an erasure operation on the first memory block regardless of the first program command being inputted to the memory device.

16. The method of claim 1, wherein
the normal cells are on top of the ground selection transistor in the plurality of cell strings, and
the string selection transistor is on top of the normal cells in the plurality of cell strings.

17. A method of operating a memory device including a first memory block having a plurality cell strings, each of the plurality of cell strings including a string selection transistor connected in series to a first dummy cell, a plurality of normal cells, a second dummy cell and a ground selection transistor, the method comprising:
programming the first dummy cell;
programming the normal cells in at least one of the plurality of cell strings after the programming the first dummy cell, the normal cells being selected based on a first program command inputted to the memory device;

erasing the first memory block after the normal cells are programmed; and reprogramming the first dummy cell, wherein the reprogramming of the first dummy cell is performed using a voltage different from a program voltage which is applied to the first dummy cell in programming the first dummy cell.

18. The method of claim 17, further comprising:

programming the normal cells in at least one cell string selected by a second program command additionally inputted to the memory device after the first dummy cells are reprogrammed, wherein the programming of the normal cells in the at least one cell string selected by the second program command is performed using a voltage different from a voltage that is used in the programming the normal cells of the at least one cell string selected by the first program command.

19. A method of operating a memory device including a first memory block having a plurality of cell strings, each of the plurality of cell strings including a string selection transistor connected in series to a first dummy cell, a plurality of normal cells, a second dummy cell and a ground selection transistor, the method comprising:

turning off the string selection transistor and the ground selection transistor; and applying a first pass voltage to a dummy word line connected with the first dummy cell and the second dummy cell, and a second pass voltage to a normal word line connected with the normal cells, wherein the applying the first pass voltage to the dummy word line increases threshold voltages of the first dummy cell and the second dummy cell by a hot carrier injection (HCI) mechanism, each of the cell strings includes the normal cells stacked on top of each other on the second dummy cell, the second dummy cell on the ground selection transistor, the first dummy cell on the normal cells, and the string selection transistor on the first dummy cell, and the applying the first pass voltage to the dummy word line is performed while a turn-off voltage is applied to a ground select line connected to the ground selection transistor and a string select line connected to the string selection transistor.

20. The method of claim 19, further comprising:

programming the normal cells after programming the first dummy cell, the normal cells being selected based on a first program command inputted to the memory device, wherein a level of the first pass voltage is different than a level of the second pass voltage.

* * * * *